United States Patent
Kamijima et al.

(10) Patent No.: US 7,854,829 B2
(45) Date of Patent: Dec. 21, 2010

(54) METHOD OF PLATING AND METHOD OF MANUFACTURING A MICRO DEVICE

(75) Inventors: Akifumi Kamijima, Tokyo (JP); Atsushi Yamaguchi, Tokyo (JP); Masahiro Saito, Tokyo (JP); Shingo Miyata, Tokyo (JP); Yuji Otsubo, Tokyo (JP); Souhei Horiuchi, Tokyo (JP)

(73) Assignee: TDK Corporation, Tokyo (JP)

( * ) Notice: Subject to any disclaimer, the term of this patent is extended or adjusted under 35 U.S.C. 154(b) by 858 days.

(21) Appl. No.: 11/812,175

(22) Filed: Jun. 15, 2007

(65) Prior Publication Data

US 2008/0006537 A1 Jan. 10, 2008

(30) Foreign Application Priority Data

Jul. 4, 2006 (JP) ............................. 2006-184786

(51) Int. Cl.
*C25D 5/02* (2006.01)

(52) U.S. Cl. ....................... 205/118; 205/125

(58) Field of Classification Search ................. 205/118, 205/122

See application file for complete search history.

(56) References Cited

U.S. PATENT DOCUMENTS 4,315,985 A * 2/1982 Castellani et al. ............ 430/314
2004/0084777 A1 * 5/2004 Yamanoue et al. .......... 257/758

FOREIGN PATENT DOCUMENTS

| JP | A-55-085691 | 6/1980 |
| JP | A 02-228493 | 9/1990 |
| JP | A 11-001799 | 1/1999 |
| JP | A-2002-020897 | 1/2002 |

* cited by examiner

*Primary Examiner*—Nam X Nguyen
*Assistant Examiner*—Luan V Van
(74) *Attorney, Agent, or Firm*—Oliff & Berridge, PLC

(57) ABSTRACT

A method of plating, which allows compositions of plating patterns of a plurality of layers to be uniform without any operational complexity, is provided. The area of the plating layer electrodeposited including plating patterns is constant in each of the plurality of layers. Accordingly, a value of plating-current density is easily maintained constant without any special operation. Consequently, the plating patterns in each of the plurality of layers is easily formed to have an uniform composition.

8 Claims, 17 Drawing Sheets

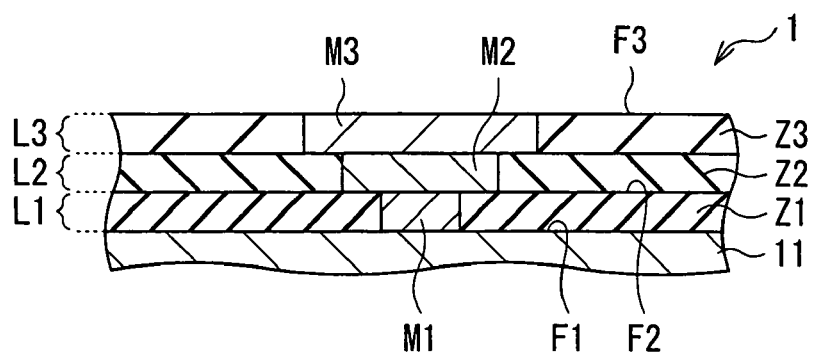
FIG. 3
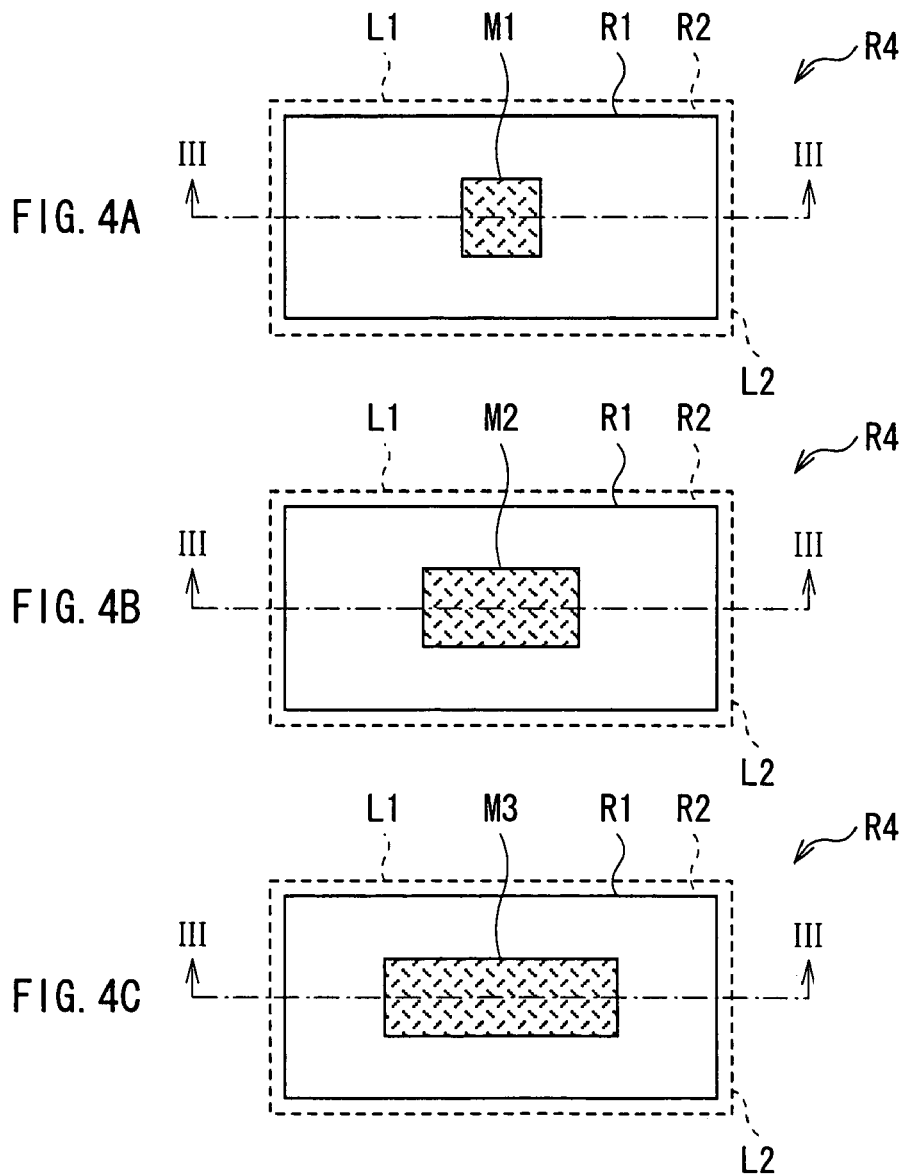
FIG. 4A
FIG. 4B
FIG. 4C

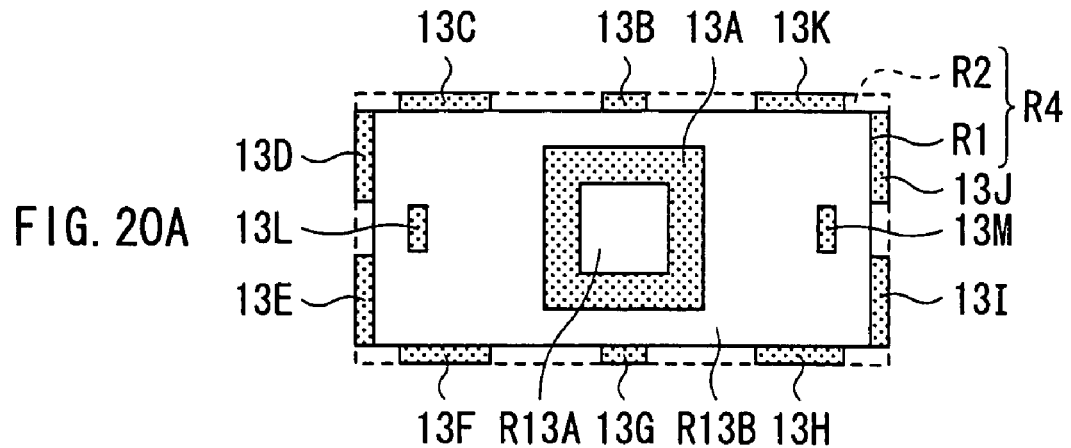
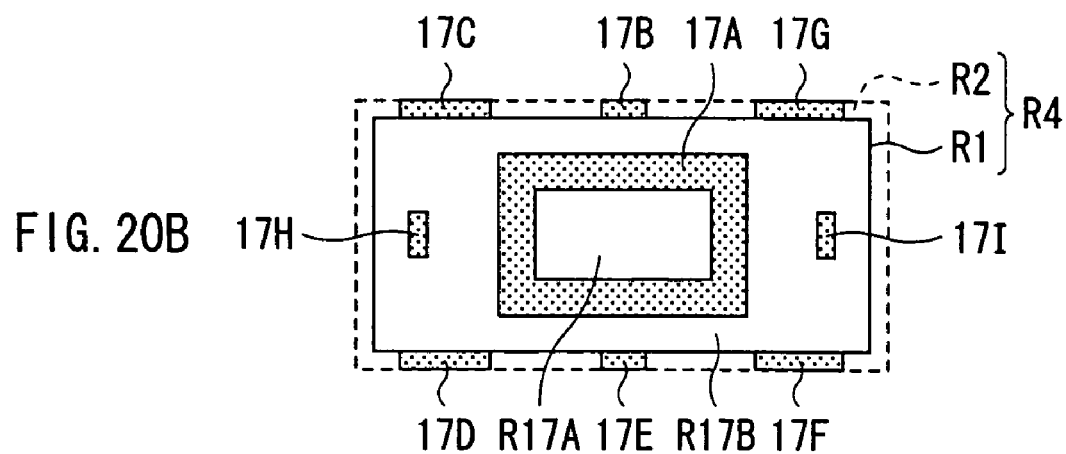
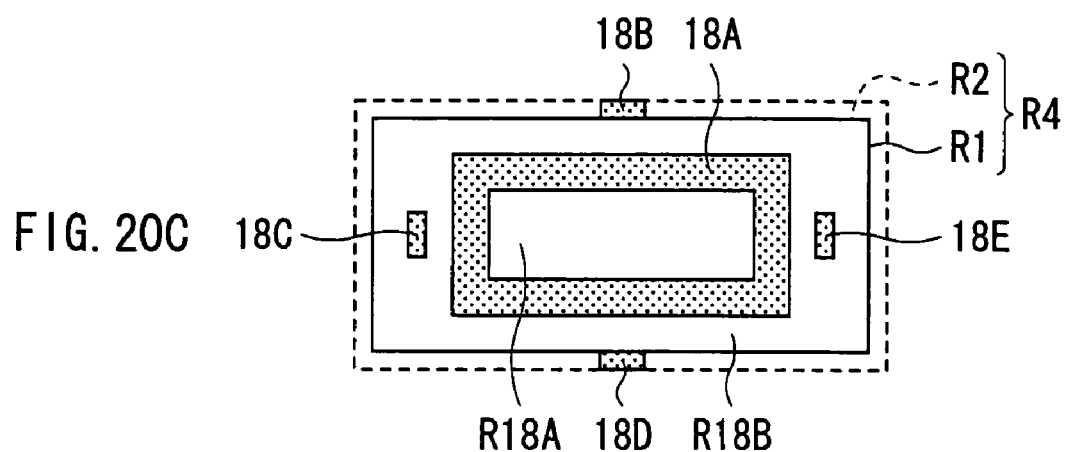

METHOD OF PLATING AND METHOD OF MANUFACTURING A MICRO DEVICE

BACKGROUND OF THE INVENTION

1. Field of the Invention

The present invention relates to a method of plating suitable for forming plating patterns of a plurality of layers, and relates to a method of manufacturing a micro device suitable for manufacturing one that includes the plating patterns of the plurality of layers.

2. Description of the Related Art

In producing various sorts of electronic circuit boards and semiconductor device substrates, plating patterns, which are formed in the shape of plurality of layers and having the same composition with each other, may be formed on a limited portion of the substrate (object to be plated). When configurations (occupation area) of the plating patterns of the plurality of layers differ mutually, plating-current density needs to be adjusted in each of the plurality of layers in the plating in spite of using a plating bath of the same component. For example, the plating-current density is adjusted by controlling electrode area as shown in Japanese Laid-Open Patent Publication (Kokai) No. H11-1799, and Japanese Laid-Open Patent Publication (Kokai) No. H2-228493.

SUMMARY OF THE INVENTION

However, operation is very complicated if every formation of the plating patterns needs adjustment of the plating-current density in each of the plurality of layers. Moreover, in spite of using a plating bath of the uniform component, compositions of the formed plating patterns tend to be quite different from each other in each layer. Since such composition difference affects the property value of the plating pattern itself, such as magnetic property, it is expected to be minimized to a maximum extent.

The present invention has been devised in view of the above problem, and it is desirable to provide a method of plating, which allows the compositions of the plating patterns of a plurality of layers to be uniformed enough in each of the plurality of layers without any operational complexity. It is also desirable to provide a method of manufacturing a micro device that includes the plating patterns of a plurality of layers so that the compositions of the plating patterns may be uniformed enough in each of the plurality of layers without any operational complexity.

A method of plating and a method of manufacturing a micro device includes a step of forming a plating layer including the plating pattern in each of plurality of layers so that an area of the plating layer electrodeposited is constant in each of the plurality of layers. Here, "the plating layer including the plating pattern" means that the plating layer includes not only the aimed plating pattern but also other portions.

According to the method of plating and manufacturing the micro device of the present invention, the area of the plating layer electrodeposited is constant in each of the plurality of layers. As a result, plating-current density can be kept constant without any adjustment of plating current or electrode area.

Preferably, the method of plating and the method of manufacturing the micro device includes steps of: forming a plating foundation layer in each of the plurality of layers, forming a resist frame and an auxiliary resist pattern on the plating foundation layer in each of the plurality of layers, forming the plating layer selectively on the plating foundation layer other than portions covered with the resist frame and the auxiliary resist pattern in each of the plurality of layers, removing the resist frame and the auxiliary resist pattern in each of the plurality of layers, and removing the plating layer other than the plating pattern surrounded by the resist frame in each of the plurality of layers, and sum total of the area of the resist frame and the auxiliary resist patterns in each of the plurality of layers is constant. Preferably, at least one of geometry and the area of the plating pattern differs between the plurality of layers. Preferably, in the formation process for each of the plurality of layers, a common plating bath is used for forming the plating layer in each of the plurality of layers. Further, it is desirable to form a plurality of the auxiliary resist patterns symmetrically with respect to the resist frame. Further, preferably, the resist frame and the auxiliary resist pattern are formed to have a line width equal to each other. The line width here means a width of, a cross section orthogonal to a longitudinally-extending direction (longitudinal direction) of each of the resist frame and the auxiliary resist pattern.

According to the method of plating or method of manufacturing the micro device of the present invention, since the area of the plating layer electrodeposited, including the plating pattern, is made constant in each of the plurality of layers, the plating patterns, each having a composition uniformed enough in each of the plurality of layers, can be formed more easily, without changing any plating condition.

Other and further objects, features and advantages of the invention will appear more fully from the following description.

BRIEF DESCRIPTION OF THE DRAWINGS

FIG. 3 is a sectional view showing a cross-sectional configuration of the layered film formed using the plating device appearing in FIG. 1.

FIGS. 4A to 4C are plan views showing a configuration of each plating pattern in the layered film shown in FIG. 3.

FIGS. 20A to 20C show a fifth modification with regard to the plan view configuration of the resist pattern shown in FIG. 9.

DESCRIPTION OF THE PREFERRED EMBODIMENTS

Embodiments of the invention will be described in detail hereinbelow with reference to the drawings.

First Embodiment

First, a plating device for implementing a formation method of a layered film as a first embodiment of the present invention, and an electrode assembly arranged therein will be described hereinbelow with reference to FIGS. 1 to 4.

Figure 1:
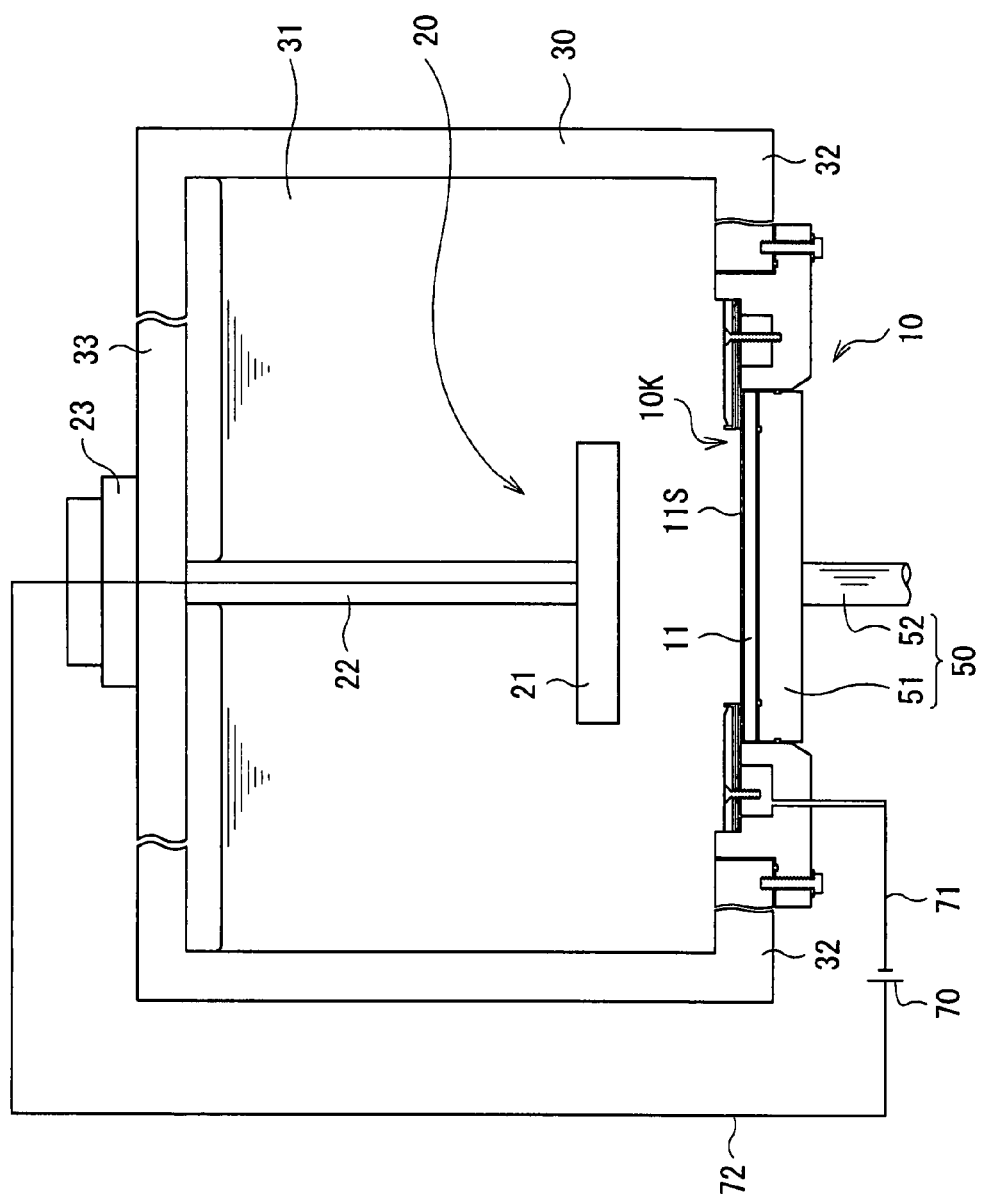
FIG. 1 is a schematic sectional view showing a whole configuration of a plating device used for formation method of a layered film according to a first embodiment of the present invention.

FIG. 1 is a schematic sectional view showing a configuration of the plating device. The plating device forms a plating layer on a surface 11S (surface to be plated) of a substrate 11, which is an object to be plated, and includes a plating liquid vessel 30 which contains a plating bath 31, and a cathode electrode assembly 10 and an anode electrode assembly 20 disposed in the plating liquid vessel 30, so as to be opposed to each other via the plating bath 31. The cathode electrode assembly 10 is attached firmly to a bottom 32 of the plating liquid vessel 30 so that the plating bath 31 may not leak. The cathode electrode assembly 10 has an aperture 10K, and the substrate 11 in the shape of a thin plate is disposed therein to cover the aperture 10K. The substrate 11 is supported by a supporting body 50 which includes a stage 51 and a cylinder 52 so that the surface 11S is in contact with the plating bath 31. The plating bath 31 has a composition in accordance with a sort of plating layer to be obtained. The plating device further has a power unit 70. The power unit 70 is electrically connected with the cathode electrode assembly 10 and the anode electrode assembly 20 by lead wires 71 and 72 respectively to apply direct current voltage between the electrodes. Although the power unit 70 of a type that applies direct current voltage is illustrated herein, it is not limited to this but what applies alternating voltage or pulse voltage can be used.

The anode electrode assembly 20 includes an anode 21, an anode cylinder 22 having the anode 21 attached to one end thereof, and a supporter 23 for fixing the other end of the anode cylinder 22 to an upper portion 33 of the plating liquid vessel 30. The anode 21 is arranged so as to face with the surface 11S via the plating bath 31, and is connected with the power unit 70 by the lead wire 72 passing through the anode cylinder 22 and the supporter 23.

In this plating device, a plating seed layer covers the surface 11S of the previously-formed substrate 11 to form the plating layer on the substrate, by applying direct current voltage between the cathode electrode assembly 10 and the anode electrode assembly 20 using the power unit 70, when the plating liquid vessel 30 is filled with the plating bath 31 as shown in FIG. 1.

Subsequently, the formation method of the layered film using this plating device will be explained with reference to FIGS. 2 to 15.

Figure 2A:
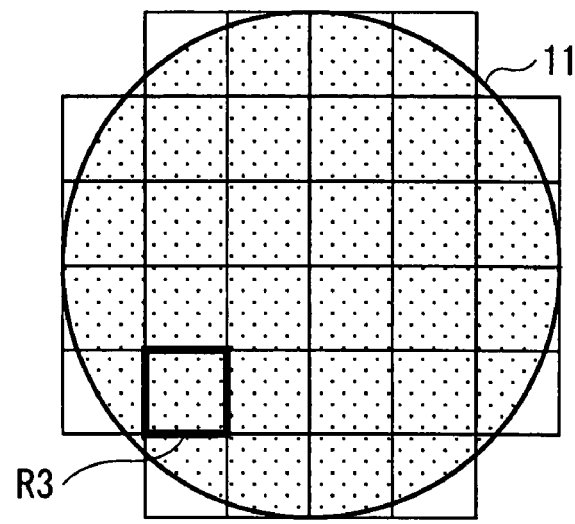
FIG. 2A is a plan view and FIG. 2B is a partially enlarged view, each showing a configuration of a substrate appearing in FIG. 1.
Figure 2B:
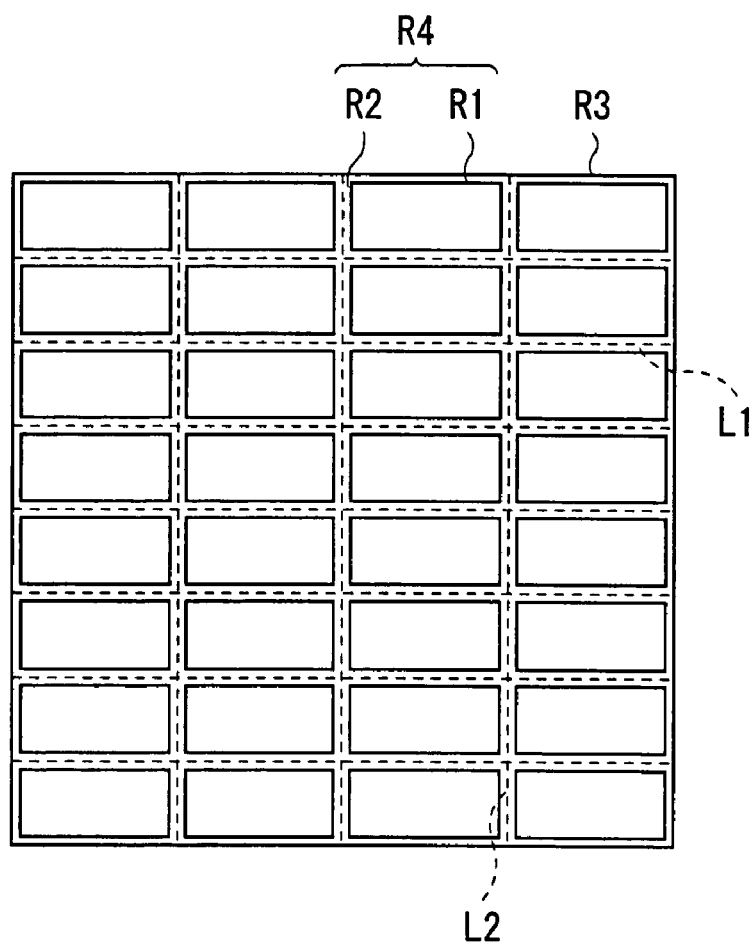
Figure 5:
FIG. 5 is a sectional view showing one production process of the layered film shown in FIG. 3 using the plating device appearing in FIG. 1.

Here, a case where layered film 1 (which will be described later) are formed on each of a plurality of element fields R1 one-by-one on the substrate 11 as schematically shown in FIGS. 2A and 2B, is explained for example.

FIG. 2A illustrates a whole configuration of the substrate 11. In FIG. 2A, each rectangular area R3, which is defined by dividing the substrate 11 into matrix, is equal to a range to be exposed by one operation of a stepper and so on (that is, an exposure region which can be exposed in one shot of the stepper), for example. FIG. 2B is an enlarged view of any one of the rectangular areas R3. The rectangular area R3 includes a plurality of unit fields R4 of a rectangular shape, that are defined by plurality of scribe lines L1 and L2. Each unit field R4 includes an element field R1 and a gap field R2 surrounding the element field R1. With such arrangement, the element fields R1 are arranged in matrix and equally spaced at specified intervals.

As shown in FIG. 3, the layered film 1 are formed by layering in order a first layer L1 that includes a plating pattern M1, a second layer L2 that includes a plating pattern M2, and a third layer L3 that includes a plating pattern M3. Peripheries of the plating patterns M1 to M3 are surrounded by insulating layers Z1 to Z3, respectively. The surfaces of the plating pattern M1 and the insulating layer Z1 form a coplanar face, the surfaces of the plating pattern M2 and the insulating layer Z2 form a coplanar face F2, and the surfaces of the plating pattern M3 and the insulating layer Z3 form a coplanar face F3. As shown in FIGS. 4A to 4C for example, the plating patterns M1 to M3 are all rectangular in plan view, but have different dimensions from each other. Namely, occupation areas of the plating patterns M1 to M3 are different from each other. However, they all have a similar composition. FIG. 3 is a sectional view showing a layered structure of the layered film 1, and FIGS. 4A to 4C are plan views showing configurations of the plating patterns M1 to M3 in plan view. Namely, FIG. 3 corresponds to cross sections taking along the lines III-III of FIGS. 4A to 4C.

Figure 6:
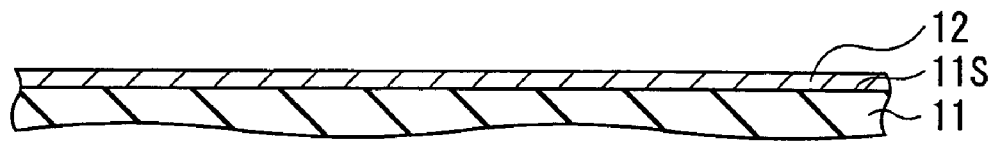
FIG. 6 is a sectional view showing another production process subsequent to FIG. 5.

Formation process of the plating pattern M1 is as follows. As first shown in FIG. 5, the substrate 11 is prepared as an object to be plated 4. Then, as shown in FIG. 6, a plating foundation layer 12 is formed to completely cover the surface 11S of the substrate 11. The plating foundation layer 12 is formed with component materials such as nickel iron alloy (NiFe) by vacuum deposition method such as sputtering, for example.

Figure 7:
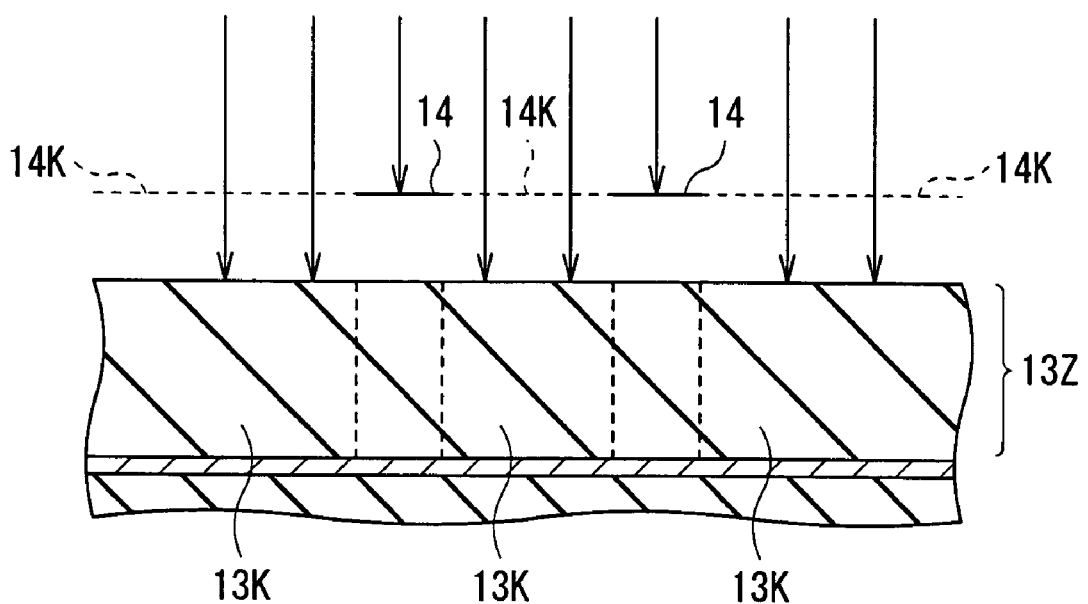
FIG. 7 is a sectional view showing another production process subsequent to FIG. 6.
Figure 8:
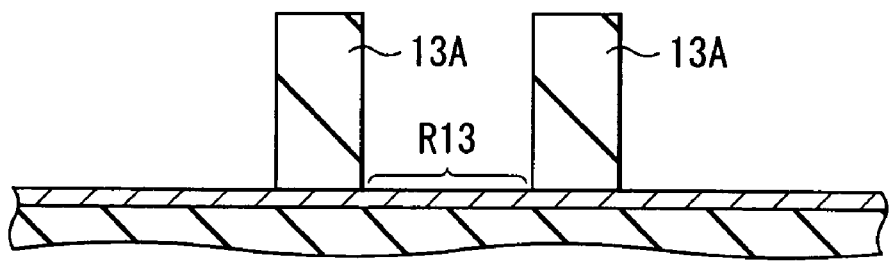
FIG. 8 is a sectional view showing another production process subsequent to FIG. 7.

Subsequently, after forming a photoresist layer 13Z so as to cover a surface of the plating foundation layer 12 completely, a photoresist pattern 13A is formed using photolithographic technique, as shown in FIG. 7. Specifically, first, a latent image portion 13K is formed by selectively exposing the photoresist layer 13Z via a photo mask 14 which has an aperture 14K of a specified shape. Subsequently, after performing heat-treatment as necessary, it is developed by dissolving and removing the latent image portion 13K using a specified developer, and further, is washed and dried. In this manner, the photoresist pattern 13A of a specified shape is completed.

Figure 9A:
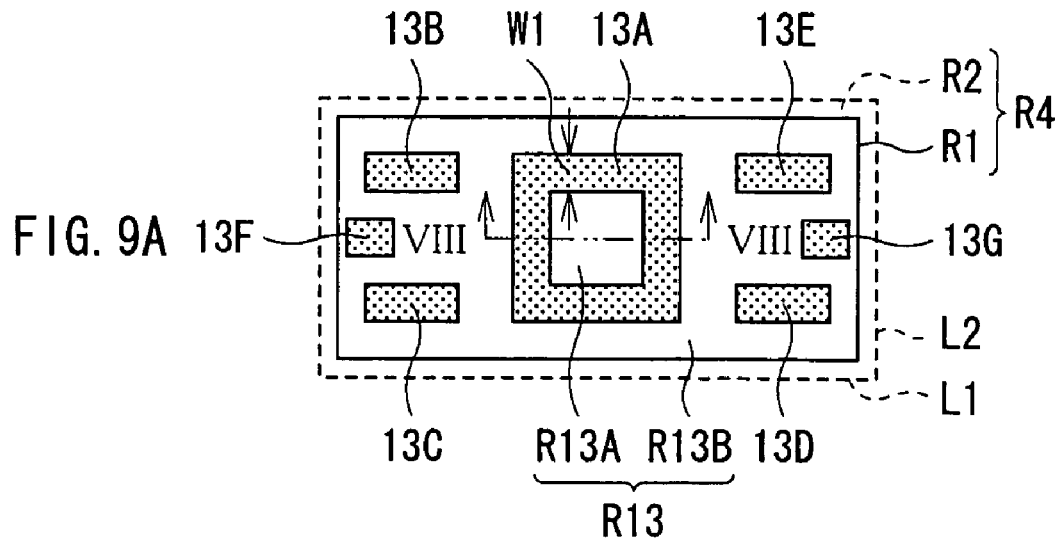
FIGS. 9A to 9C are plan views of a resist pattern shown in FIG. 8.

As shown in FIG. 9 (A), photoresist patterns 13B to 13G, as an auxiliary pattern, are formed together with the formation of the photoresist pattern 13A. FIG. 9A is plan view showing a planar configuration and layout of the photoresist patterns 13A to 13G (hereinafter generically called photoresist pattern 13). Namely, FIG. 8 corresponds to a cross section taking along the line VIII-VIII of FIG. 9A, seen from the direction indicated by an arrow. The photoresist pattern 13A is disposed so as to surround a portion R13A in which the plating pattern M1 will be formed (hereinafter called formation portion) Meanwhile, it is preferred that the other photoresist patterns 13B to 13G are disposed symmetrically with respect to the photoresist pattern 13A so that the photoresist pattern 13A may be centered. In this case, it is desirable that geometries and dimensions of each pair of the mutually-symmetrically disposed photoresist patterns of the photoresist patterns 13B to 13G are equal to each other, and a part of the photoresist patterns 13B to 13G is W1, which is equal to a part of the width of the photoresist pattern 13A. Here, it is defined that an auxiliary portion R13B is an area excluding the portions occupied by the photoresist pattern 13 and the formation portion R13A from the unit field R4. Accordingly, sum total of the formation portion R13A and the auxiliary portion R13B are taken as an area to be plated, denoted by a plating portion R13.

Figure 10:
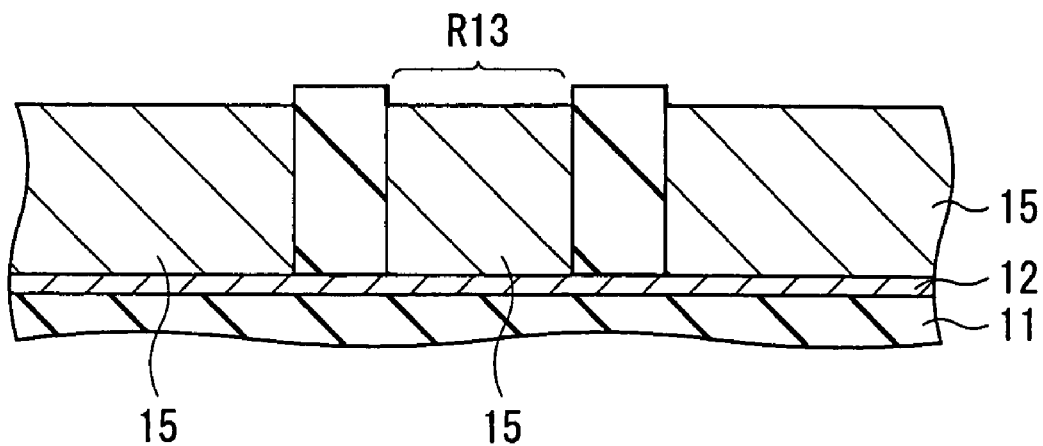
FIG. 10 is a sectional view showing another production process subsequent to FIG. 8.

After forming the photoresist pattern 13, plating is processed using the aforementioned plating device, and as shown in FIG. 10, a plating layer 15 made of NiFe is formed. The plating layer 15 is formed so as to occupy the plating portion R13 shown in FIG. 9A. At this time, the photoresist pattern 13A works as a photoresist frame defining the outline of the plating pattern M1, which will be obtained eventually.

Figure 11:
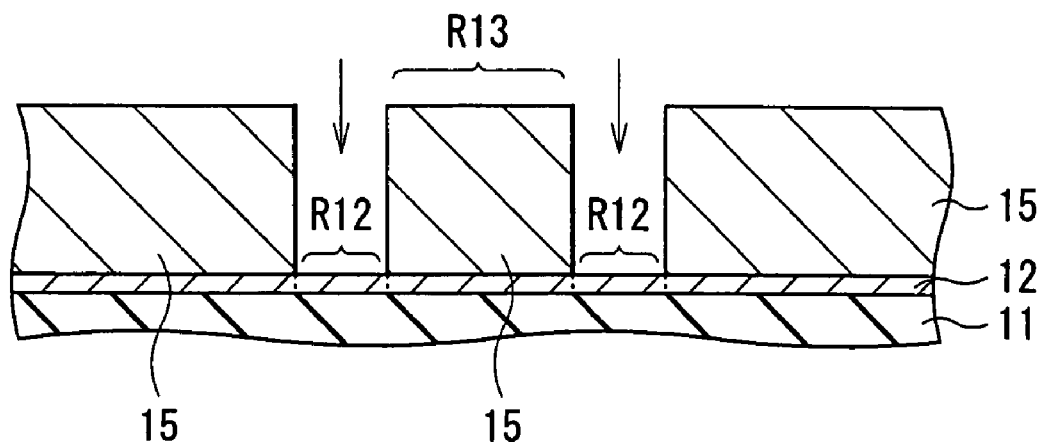
FIG. 11 is a sectional view showing another production process subsequent to FIG. 10.
Figure 12:
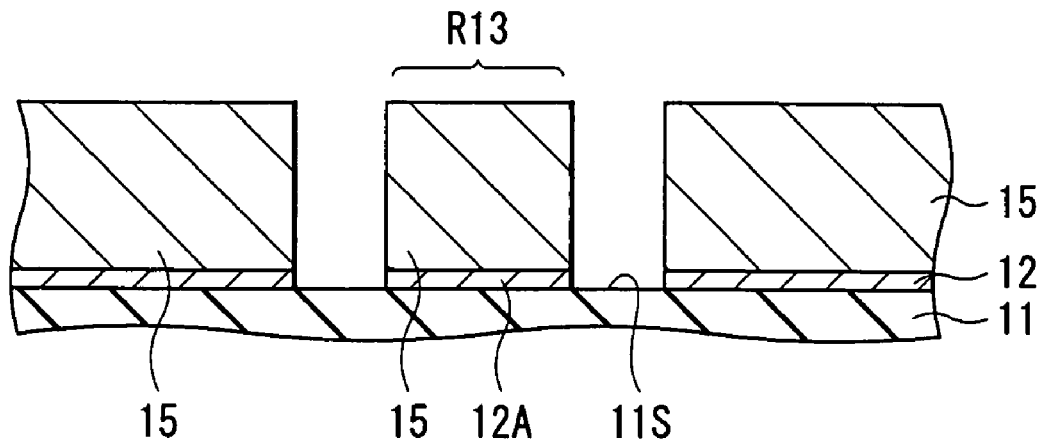
FIG. 12 is a sectional view showing another production process subsequent to FIG. 11.

After the formation of the plating layer 15, the plating foundation layer 12 is partially exposed by removing the photoresist pattern 13 using an organic solvent as shown in FIG. 11. Further, an exposed portion R12 of the plating foundation layer 12 is removed by milling or the like, using the plating layer 15 as an etching mask. In this manner, as shown in FIG. 12, the surface 11S of the substrate 11 is partially exposed.

Figure 13:
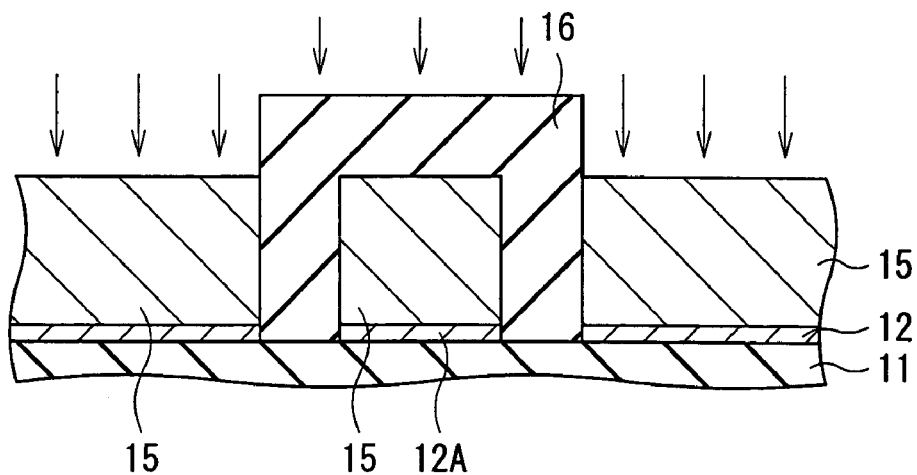
FIG. 13 is a sectional view showing another production process subsequent to FIG. 12.
Figure 14:
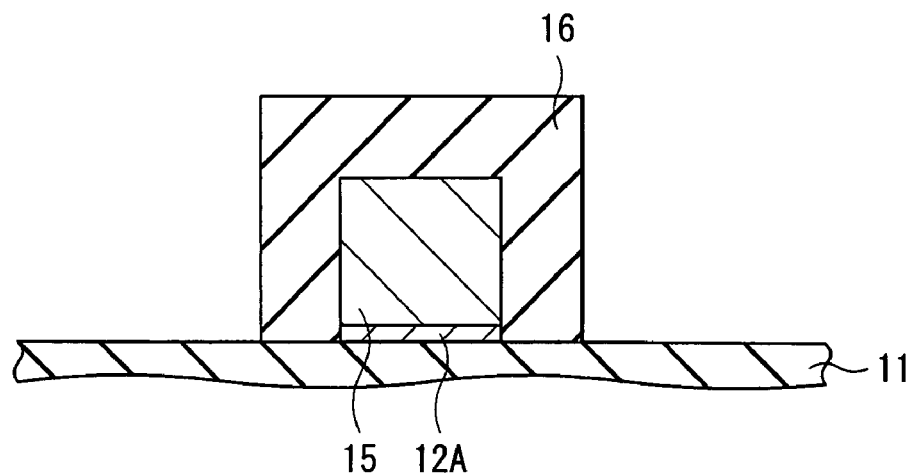
FIG. 14 is a sectional view showing another production process subsequent to FIG. 13.
Figure 15:
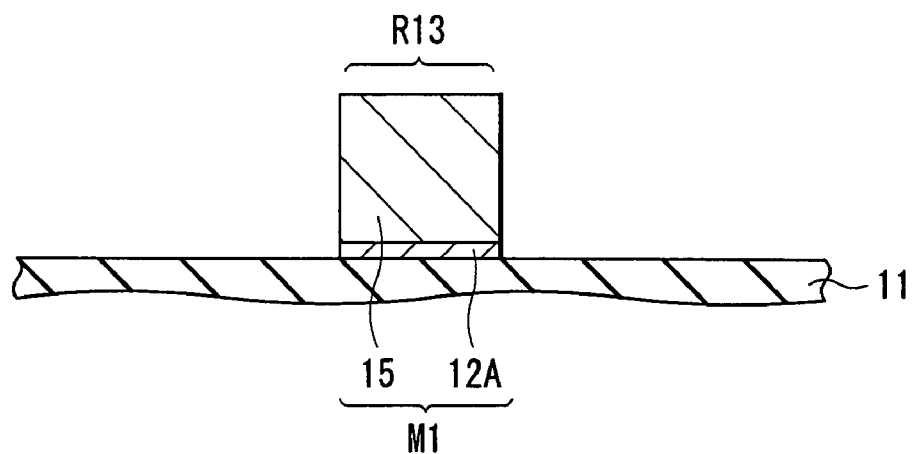
FIG. 15 is a sectional view showing another production process subsequent to FIG. 14.

Subsequently, after selectively forming a photoresist pattern 16 so as to cover the formation portion R13 and the exposed surface 11S as shown in FIG. 13, the plating layer 15 that is not covered by the photoresist pattern 16 is removed by wet etching as shown in FIG. 14. Finally, as shown in FIG. 15, the plating pattern M1, which is formed on the formation portion R13 constituted by the plating layer 15 and the plating foundation layer 12A, appears by removing the photoresist pattern 16 with an organic solvent or the like.

Formation process of each plating patterns M1-M3 is substantially the same. Namely, the process of forming the plating pattern M2 on the plating pattern M1 is as follows. First, an electrical insulating material such as aluminium oxide ($Al_2O_3$) is formed in the state of FIG. 15 so that the periphery of the plating pattern M1 may be fully filled up, for example. Subsequently, flattening is performed until a surface of the plating pattern M1 is exposed so that the coplanar face F1 that is formed by the plating pattern M1 and the insulating layer Z1 is obtained. After this, the plating pattern M2 is formed by repeating each formation process of FIGS. 6 to 15. Similarly, the plating pattern M3 is layered on the coplanar face F2 formed by the plating pattern M2 and the insulating layer Z2, thereby completing the layered film 1 shown in FIG. 3.

Figure 9B:
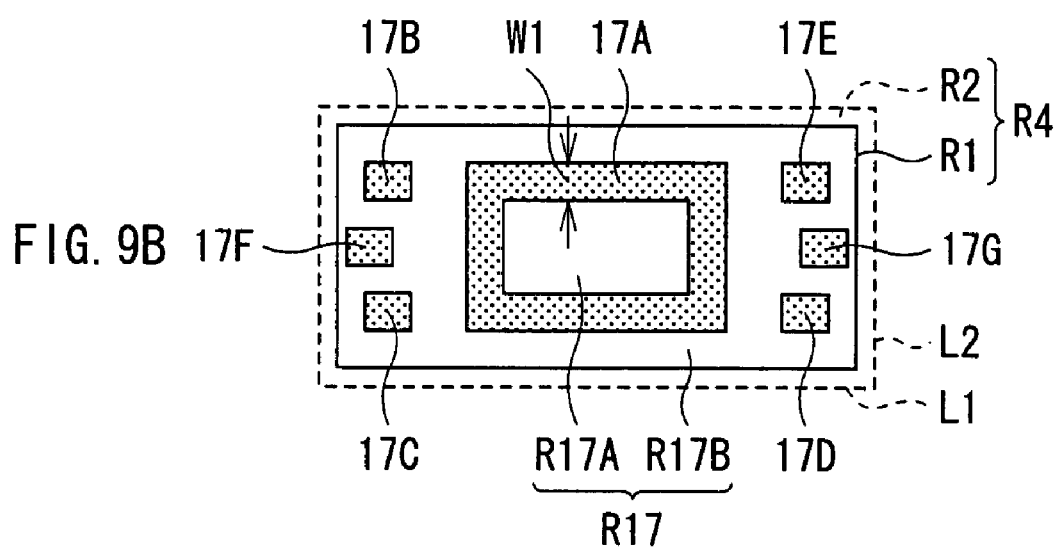

In forming each of the plating patterns M1 to M3, one or more photoresist patterns are formed so that a total occupation area of each of the plating patterns may be equal to each other, and plating process is selectively performed using the same plating bath 31. More specifically, in forming the plating pattern M2, photoresist patterns 17B to 17G are formed as an auxiliary pattern, together with the formation of a photoresist pattern 17A, as shown in FIG. 9B. The photoresist pattern 17A is disposed so as to surround a portion R17A in which the plating pattern M2 will be formed (hereinafter called as formation portion R17A), and works as a photoresist frame defining the outline of the plating pattern M2. FIG. 9B is a plan view showing a configuration of the photoresist patterns 17A to 17G (hereinafter generically called photoresist pattern 17) in plan view. Herein, sum total of the occupation areas of the photoresist pattern 17 is made equal to that of the photoresist pattern 13. In other words, the occupation area of a plating portion R17, which is sum total of the formation portion R17A and an auxiliary portion R17B, is made equal to the occupation area of the plating portion R13.

Figure 9C:
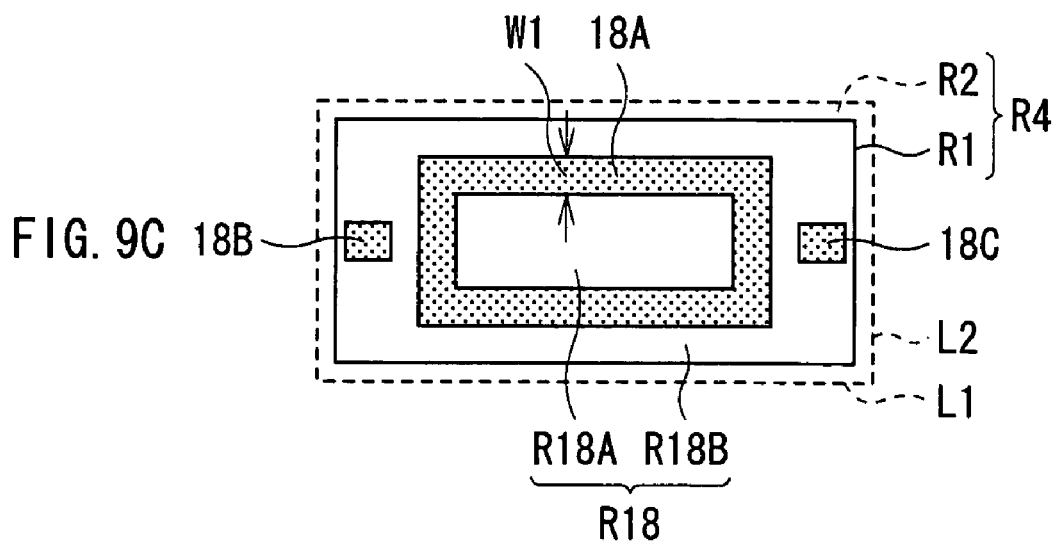

Also, the plating pattern M3 is formed in a similar way. As shown in FIG. 9C, photoresist patterns 18B and 18C as an auxiliary pattern are formed together with a photoresist pattern 18A as a photoresist frame. The photoresist pattern 18A is disposed so as to surround a portion (formation portion) R18A in which the plating pattern M3 will be formed, and works as a photoresist frame defining the outline of the plating pattern M3. FIG. 9C is a plan view showing a configuration of the photoresist patterns 18A to 18C (hereinafter generically called photoresist pattern 18) in plan view. Herein, sum total of the occupation areas of the photoresist pattern 18 is made equal to that of the photoresist pattern 13, and that of the photoresist pattern 17, respectively. Namely, the occupation area of a plating portion R18, which is sum total of the formation portion R18A and an auxiliary portion R18B, is made equal to the occupation area of the plating portion R13, and the occupation area of the plating portion R17, respectively.

As described above, in the present embodiment, since the sum total of the occupation areas of the photoresist pattern 13, the sum total of the occupation areas of the photoresist pattern 17, and the sum total of the occupation areas of the photoresist pattern 18 are all equal to each other, an area of each of the plating portions R13, R17 and R18, used for the plating process of the plating patterns M1 to M3, that is, an electrodeposition area, is always made equal to each other. Accordingly, plating-current density can be easily kept constant without changing a current value. As a result, the plating patterns M1-M3 of an almost identical composition can be formed quite efficiently. In particular, difference in composition can be suppressed substantially when the auxiliary patterns such as the photoresist patterns 13B to 13G are arranged evenly around the photoresist frame such as the photoresist pattern 13A.

<Modification>

Layout of the photoresist patterns 13, 17 and 18 are not limited to those shown in FIGS. 9A to 9C, and various modifications are available. Hereafter, some modifications of the present embodiment are shown.

Figure 16A:
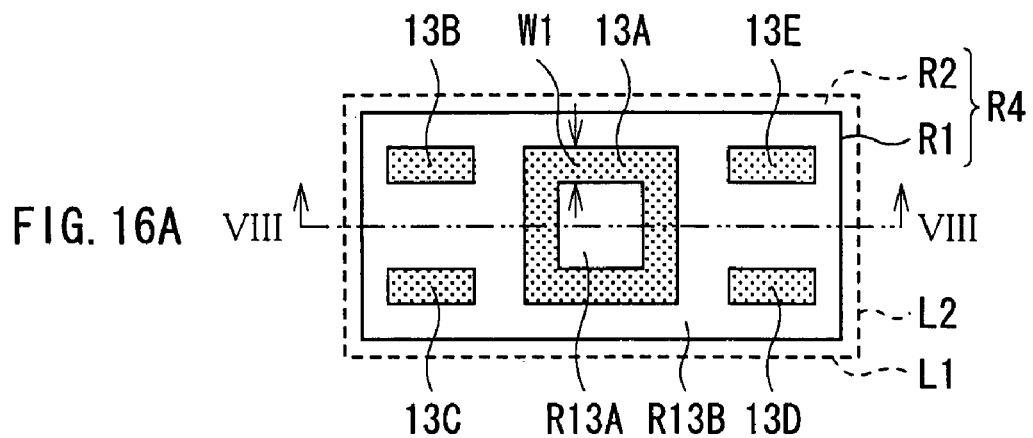
FIGS. 16A to 16C show a first modification with regard to a plan view configuration of the resist pattern shown in FIG. 9.
Figure 16B:
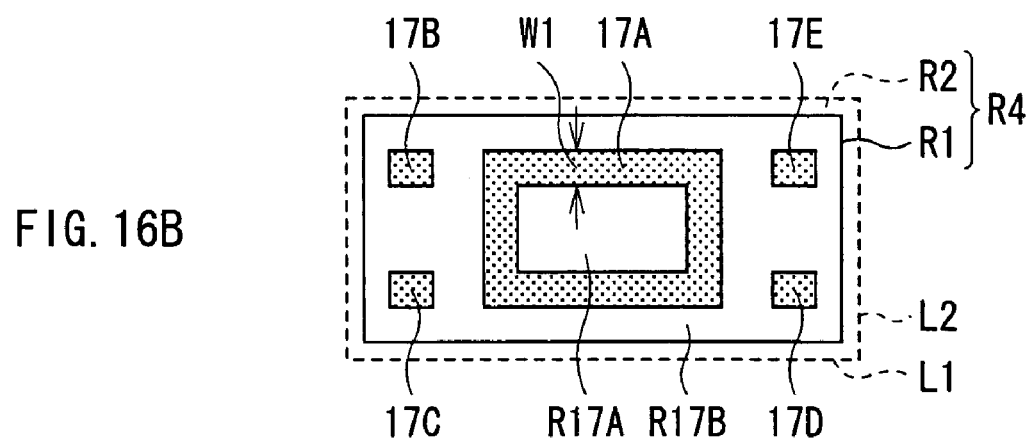
Figure 16C:
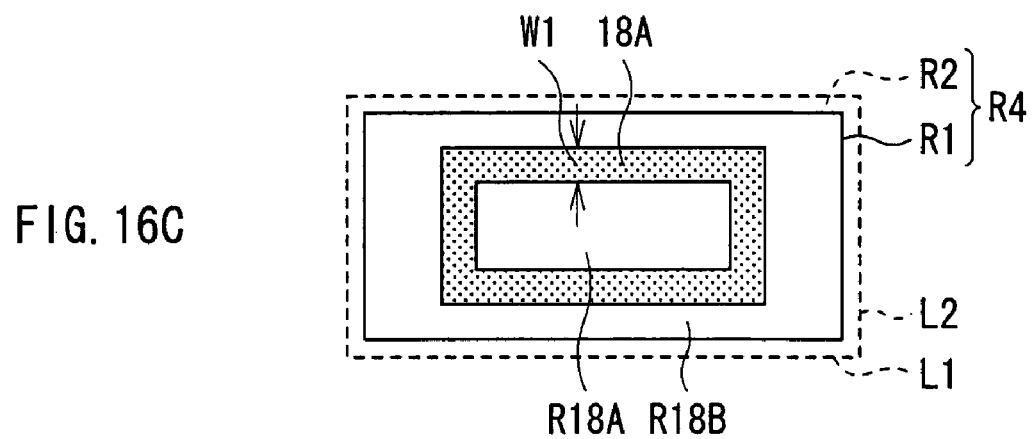

A first modification shown in FIGS. 16A to 16C is that the photoresist patterns 13 and 17 are respectively formed on the basis of the photoresist pattern 18A, which defines the outline of the largest plating pattern M3 so that sum totals of the occupation areas of the photoresist patterns 13 and 17 may be equal to the occupation area of the photoresist pattern 18A, respectively. Namely, in forming the plating pattern M3, only the photoresist pattern 18A working as a photoresist frame is formed, and formation of the other portions corresponding to the photoresist patterns 18B and 18C shown in FIG. 9C is omitted. On the other hand, in the cases of FIGS. 16A and 16B, four photoresist patterns 13B to 13E (or 17B to 17E) are formed as an auxiliary pattern. Here, the photoresist patterns 13B to 13E are all identical in shape and dimension, and are arranged symmetrically with respect to the central photoresist-pattern 13A as shown in FIG. 16A. Similarly, the photoresist patterns 17B to 17E are all identical in shape and dimension, and are arranged symmetrically with respect to the central photoresist-pattern 17A as shown in FIG. 16B.

Figure 17A:
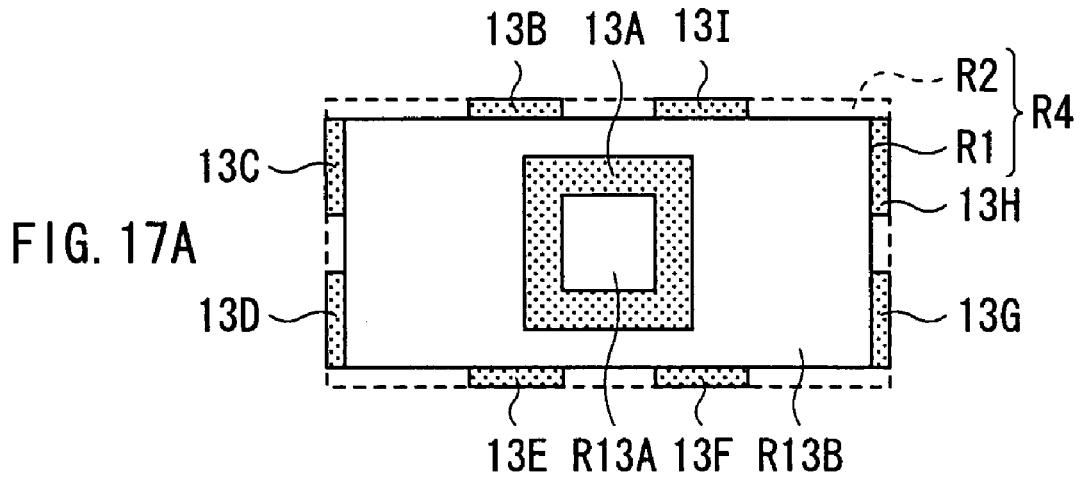
FIGS. 17A to 17C show a second modification with regard to the plan view configuration of the resist pattern shown in FIG. 9.
Figure 17B:
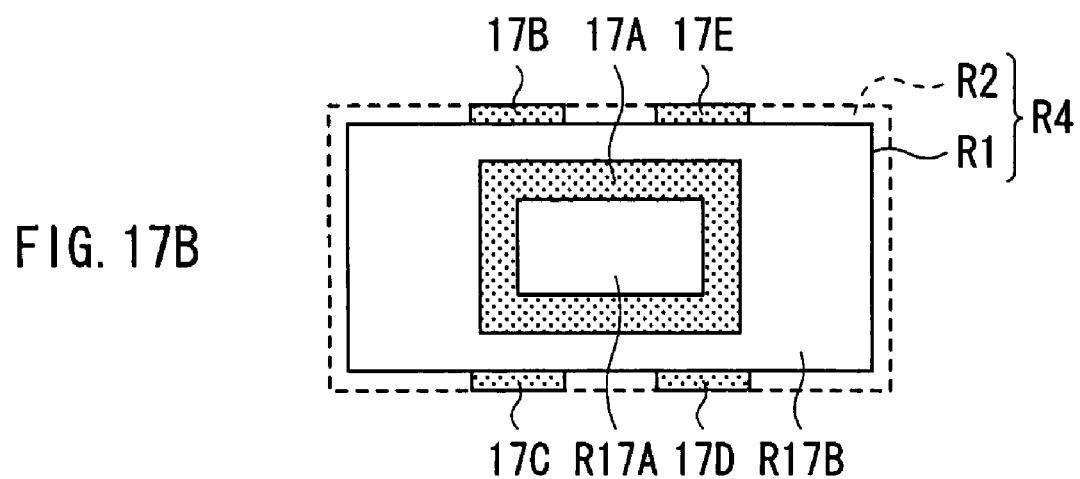
Figure 17C:
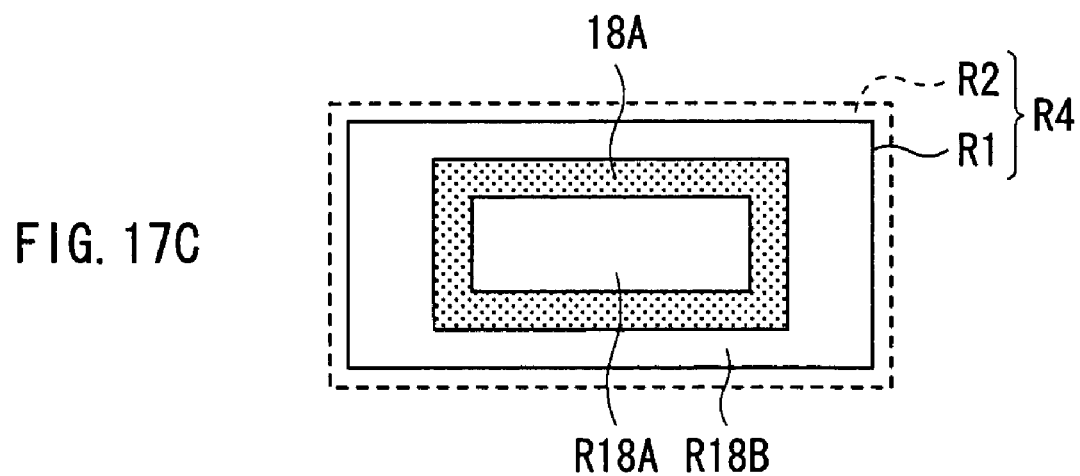

In a second modification shown in FIGS. 17A to 17C, the auxiliary pattern is provided in the gap field R2 instead of the element field R1. Also in this case, the occupation area of the photoresist pattern 18A is equal to sum total of the photoresist patterns 13A to 13E, and that of the photoresist patterns 17A to 17E, respectively.

Figure 18A:
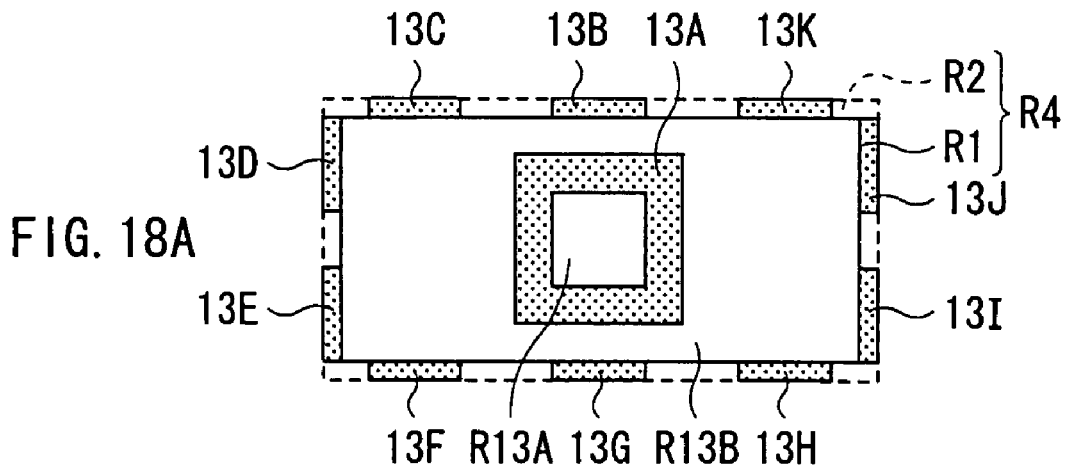
FIGS. 18A to 18C show a third modification with regard to the plan view configuration of the resist pattern shown in FIG. 9.
Figure 18B:
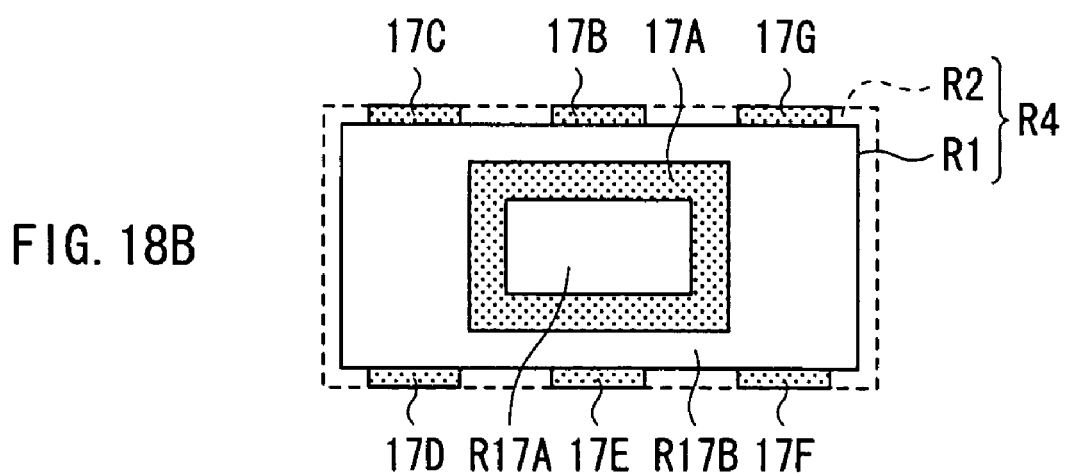
Figure 18C:
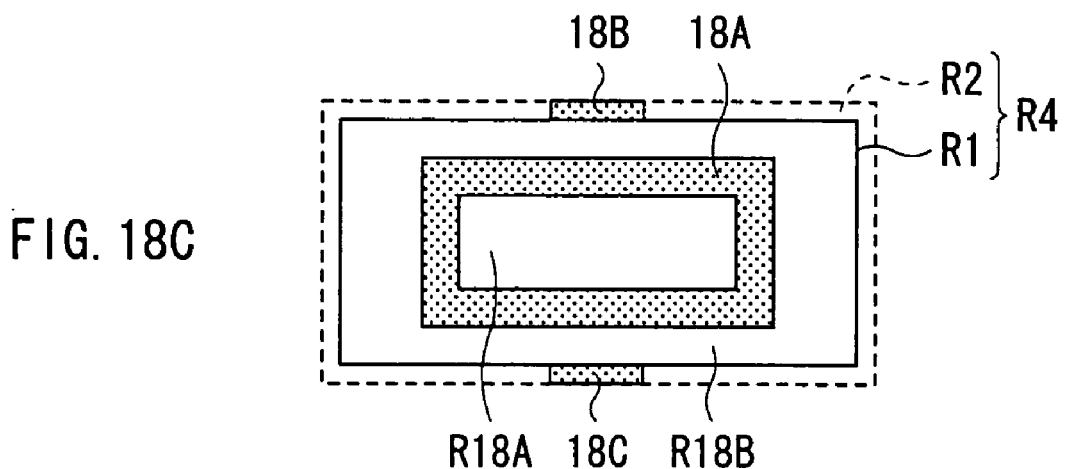

Similarly, in a third modification thereof shown in FIGS. 18A to 18C, the auxiliary pattern is provided in the gap field R2. Also in this case, sum total of the occupation areas of the photoresist patterns 13A to 13K, that of the photoresist patterns 17A to 17G, and that of the photoresist patterns 18A to 18C, are all equal to each other.

Figure 19A:
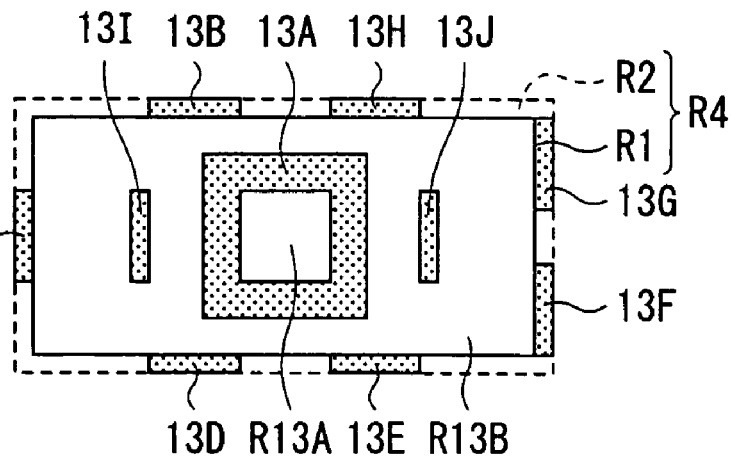
FIGS. 19A to 19C show a fourth modification with regard to the plan view configuration of the resist pattern shown in FIG. 9.
Figure 19B:
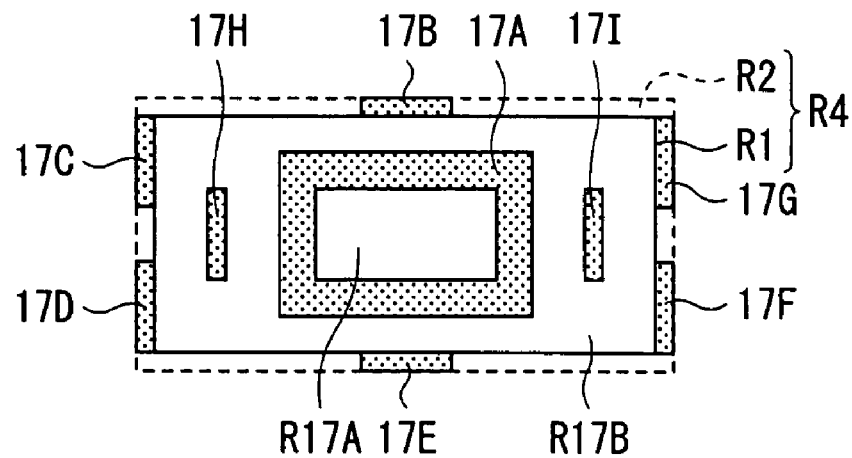
Figure 19C:
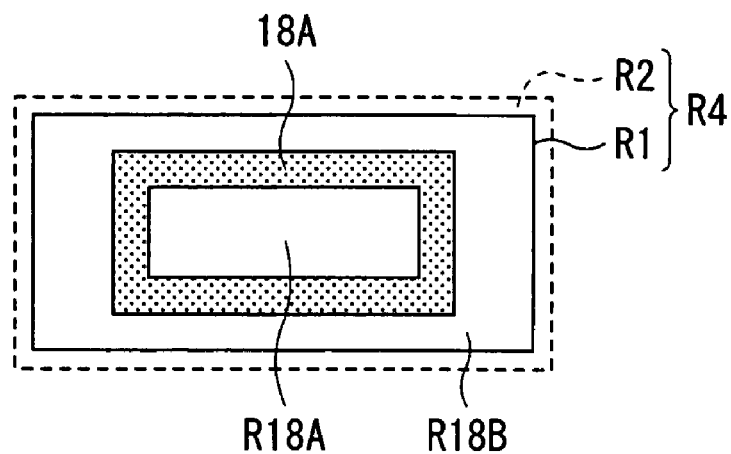

In a fourth modification shown in FIGS. 19A to 19C and a fifth modification shown in FIG. 20A to 20C, the auxiliary pattern is provided in both of the element field R1 and the gap field R2. Also in these cases, sum total of the occupation areas of the photoresist pattern 13, that of the photoresist pattern 17, and that of the photoresist pattern 18, are all equal to each other.

Second Embodiment

Subsequently, a thin film magnetic head and method of manufacturing the same will be described with reference to FIGS. 21 to 26, according to a second embodiment of the present invention.

The thin film magnetic head of the second embodiment includes a plurality of plating patterns such as a lower shielding layer and an upper shielding layer, respectively formed in layers different from each other. First, a schematic configuration of the thin film magnetic head is explained hereinbelow, and detailed description of the shielding layers will be given later.

Figure 21:
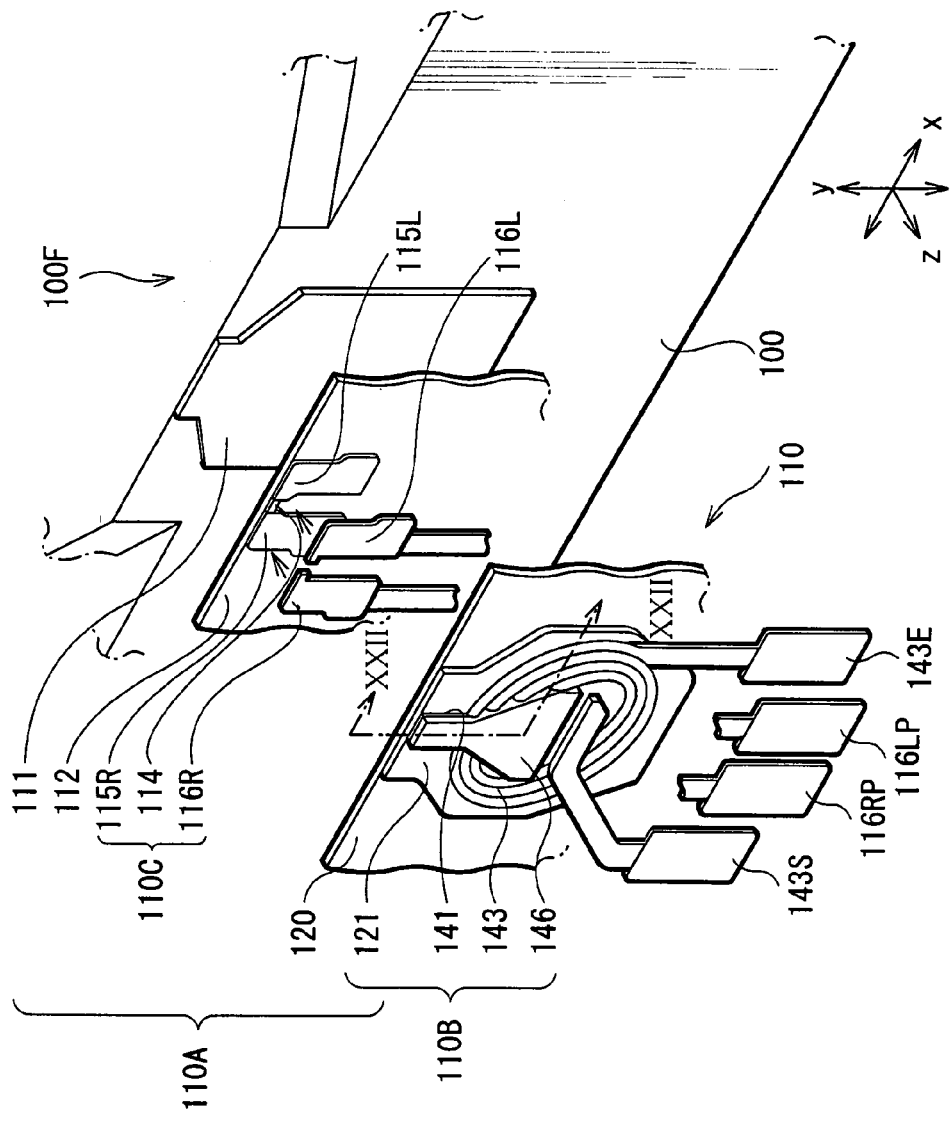
FIG. 21 is an exploded perspective view showing a configuration of a thin film magnetic head, which is formed by a method of manufacturing the same according to a second embodiment of the present invention.
Figure 22:
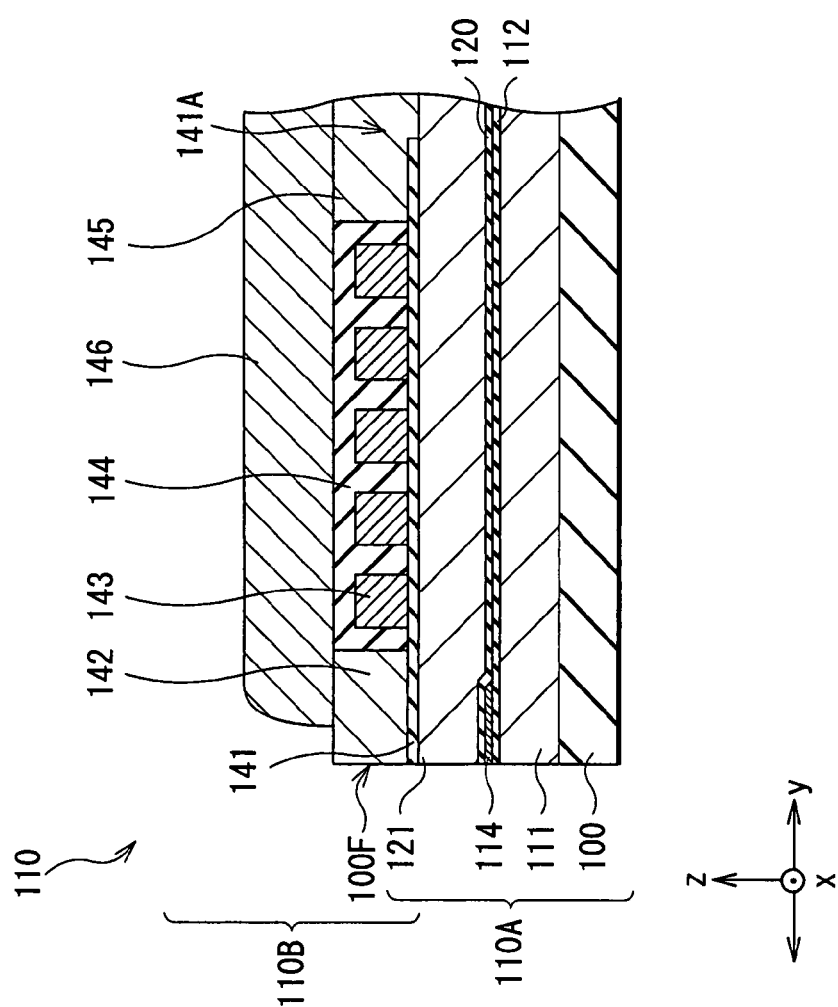
FIG. 22 is a sectional view showing a configuration taken along the line XXI-XXI of the thin film magnetic head shown in FIG. 21, which is seen from the direction indicated by arrows.

FIG. 21 is an exploded perspective view showing a configuration of a thin film magnetic head 110 formed on one side of a slider in a magnetic head device. FIG. 22 is a sectional view showing a configuration taken along the line XXI-XXI of FIG. 21, seen from the direction indicated by the arrow. As shown in FIGS. 21 and 22, the thin film magnetic head 110 is formed by layering a read head portion 110A and a write head portion 110B in order from a side close to a substrate 100 of the slider. The write head portion 110B writes magnetic information on a magnetic recording medium, and the read head portion 110A reproduces the magnetic information written on the magnetic recording medium.

As shown in FIGS. 21 and 22, the read head portion 110A is configured in such a manner that, on a side exposed to an air bearing surface (hereinafter called ABS) 100F, a lower shielding layer 111, a lower gap layer 112, a magnetoresistive (hereinafter called MR) element 110C, an upper gap layer 120 and an upper shielding layer 121 are layered in order on the substrate 100, for example.

The MR element 110C includes a magnetoresistive film pattern (hereinafter called MR film pattern) 114, a pair of magnetic domain controlling layers 115L and 115R extending on the both sides of the MR film pattern 114, and a pair of conductive lead layers 116L and 116R formed on the pairs of magnetic domain controlling layers 115L and 115 respectively. The MR film pattern 114 has a spin valve structure, which is typically configured in such a manner that a foundation layer, a pinning layer, a pinned layer, a non-magnetic layer, a free layer and a cap layer and so on are layered in order on the lower gap layer 112. The MR film pattern 114 functions as a sensor for reading the information written on the magnetic recording medium. The pair of magnetic domain controlling layers 115L and 115R and the pair of conductive lead layers 116L and 116R are arranged so that they may be opposed to each other on both sides of the MR film pattern 114 along a direction corresponding to a direction of a write track width of the magnetic recording medium (that is, X-direction). The magnetic domain controlling layers 115L and 115R, which are typically formed by a hard magnetic material containing a cobalt platinum alloy (CoPt) or the like, arrange magnetic domain directions of free layers included in the MR film pattern 114 into a single domain so as to suppress generation of a Barkhausen noise. The conductive lead layers 116L and 116R, which are typically made of copper (Cu) or the like, work as a current path sending a sensing current to the MR film pattern 114 in a direction orthogonal to the layered direction (that is, X-direction), and, as shown in FIG. 21, are connected to electrodes 116LP and 116RP, respectively.

The lower shielding layer 111 is typically made of a magnetic material such as a nickel iron alloy (NiFe), and works so that the MR film pattern 114 may not be affected by unnecessary magnetic field. The lower gap layer 112 is made of an electrical insulating material such as aluminium oxide ($Al_2O_3$) and aluminum nitride (AlN), and is intended for electrical insulation between the lower shielding layer 111 and the MR film pattern 114. Upper gap layer 120 is also made of an electrical insulating material as with the lower gap layer 112, and is intended for electrical insulation between the upper shielding layer 121 and the MR film patterns 114. The upper shielding layer 121 is made of a magnetic material such as a nickel iron alloy (NiFe) as with the lower shielding layer 111, and works so that the MR film pattern 114 may not be affected by unnecessary magnetic field. The upper shielding layer 121 also works as a lower magnetic pole in the write head portion 110B. It is to be noted that another lower magnetic pole may be provided separately from the upper shielding layer 121.

In the read head portion 110A configured in this manner, a magnetization direction of the free layer of the MR film pattern 114 changes in accordance with a signal magnetic field applied from the magnetic recording medium. Accordingly, a magnetization direction of the pinned layer included in the MR film pattern 114 changes relatively. In this case, variation of magnetization directions is expressed by variation of electric resistance by sending the sensing current to the MR film pattern 114 via the pair of conductive lead layers 116L and 116R. With this, the signal magnetic field is detected to read magnetic information.

The write head portion 110B includes the upper shielding layer 121, a write gap layer 141, a pole chip 142, a coil 143, a photoresist layer 144, a connecting portion 145 and an upper magnetic pole 146, as shown in FIGS. 21 and 22.

The write gap layer 141 is made of an electrical insulating material such as $Al_2O_3$ and AlN, and is formed on the upper shielding layer 121. The write gap layer 141 has an aperture 141A for formation of a magnetic path in a position corresponding to the center of the coil 143 in the XY-plane (refer to FIG. 21). The coil 143 is formed in the shape of a spiral in plan view around the aperture 141A on the write gap layer 141. Further, the photoresist layer 144 is formed in a specified pattern so as to cover the coil 143. Here, the photoresist layer 144 has been cured in advance by heat-treatment. Terminals of the coil 143 are connected to electrodes 143S and 143E, respectively. The pole chip 142 is arranged between the coil 143 covered with the photoresist layer 144 on the write gap layer 141 and the ABS100F. The connecting portion 145 is arranged so as to cover the aperture 141A.

The upper magnetic pole 146, which is made of a magnetic material having a high saturation magnetic flux density such as a NiFe alloy or iron nitride (FeN), is formed so as to cover the pole chip 142, the photoresist layer 144 and the connecting portion 145. The upper magnetic pole 146 connects the pole chip 142 and the connecting portion 145 magnetically, and further, is in contact with the upper shielding layer 121 via the connecting portion 145 to be magnetically connected therewith. Although not illustrated, it is to be noted that an overcoat layer made of $Al_2O_3$ and so on covers the whole upper surface of the write head portion 110B.

The write head portion 110B with such configuration writes information in such a manner as follows. Magnetic flux is generated by currents flowing through the coil 143 in the magnetic path constructed mainly by the upper shielding layer 121 and the upper magnetic pole 146. The magnetic flux then produces a signal magnetic field around the write gap layer 141, and the signal magnetic field magnetizes the magnetic recording medium to write information thereon.

Next, method of manufacturing the thin film magnetic head 110 will be explained.

First, whole picture of the method of manufacturing the thin film magnetic head 110 is explained with reference to FIGS. 21 and 22.

First, after forming the lower shielding layer 111 which is typically made of NiFe by electroplating on the substrate 100, the lower gap layer 112 is formed by sputtering or the like on the lower shielding layer 111. Next, a multilayer film which will become the MR film pattern 114 is formed on the lower gap layer 112. Specifically, the foundation layer, the pinning layer, the pinned layer, the non-magnetic layer, the free layer and the cap layer, all of which are not illustrated, are layered in order by sputtering or the like. Then, the multilayer film is selectively etched by photolithographical patterning, ion milling and the like, to form the MR film pattern 114. After this, the pair of magnetic domain controlling layers 115L and 115R are formed on the lower gap layer 112 so that they may be opposed to each other on both sides of the MR film pattern 114. Further, the conductive lead layers 116L and 116R are formed on the magnetic domain controlling layers 115L and 115R, respectively. Subsequently, the upper gap layer 120 is formed by sputtering for example so as to cover the whole body. Finally, the upper shielding layer 121, which is typically made of NiFe, is selectively formed by electroplating on the upper gap layer 120, and formation of the read head portion 110A is generally completed.

Subsequently, the write head portion 10B is formed on the read head portion 110A.

Specifically, first, the write gap layer 141 is selectively formed on the upper shielding layer 121 by sputtering or the like, and is partially etched to form the aperture 141A for forming the magnetic path. Next, the pole chip 142 is formed on the write gap layer 141 on the ABS100F side by electroplating, and the connecting portion 145 is formed by electroplating so that the aperture 141A may be covered. Further, the coil 143 of a spiral shape is formed around the aperture 141A, then the photoresist layer 144 is formed in a specified pattern so that the coil 143 may be covered, and is cured by heat-treatment. After forming the photoresist layer 144, the upper magnetic pole 146 is selectively formed so as to connect the pole chip 142 and the connecting portion 145. In this manner, formation of the write head portion 110B is generally completed.

Finally, the overcoat layer which is not illustrated is formed so as to cover all the foregoing structures including the upper magnetic pole 146. In this manner, formation of the thin film magnetic head 110 which is constituted by the read head portion 110A and the write head portion 110B is completed.

Subsequently, formation process of the lower shielding layer 111 and the upper shielding layer 121 is explained in detail with reference to FIGS. 23 to 26. FIGS. 23 to 26 is a plan view showing each production process when the lower shielding layer 111 and the upper shielding layer 121 are formed.

In forming the lower shielding layer 111, s plating foundation layer (not shown) which is made of NiFe is formed so that a surface of the substrate 100 may be covered. Subsequently, after forming a resist layer (not shown) so that the whole plating foundation layer may be covered, a photoresist pattern 113A of a specified shape as shown in FIG. 23 is formed by photolithography.

Figure 23:
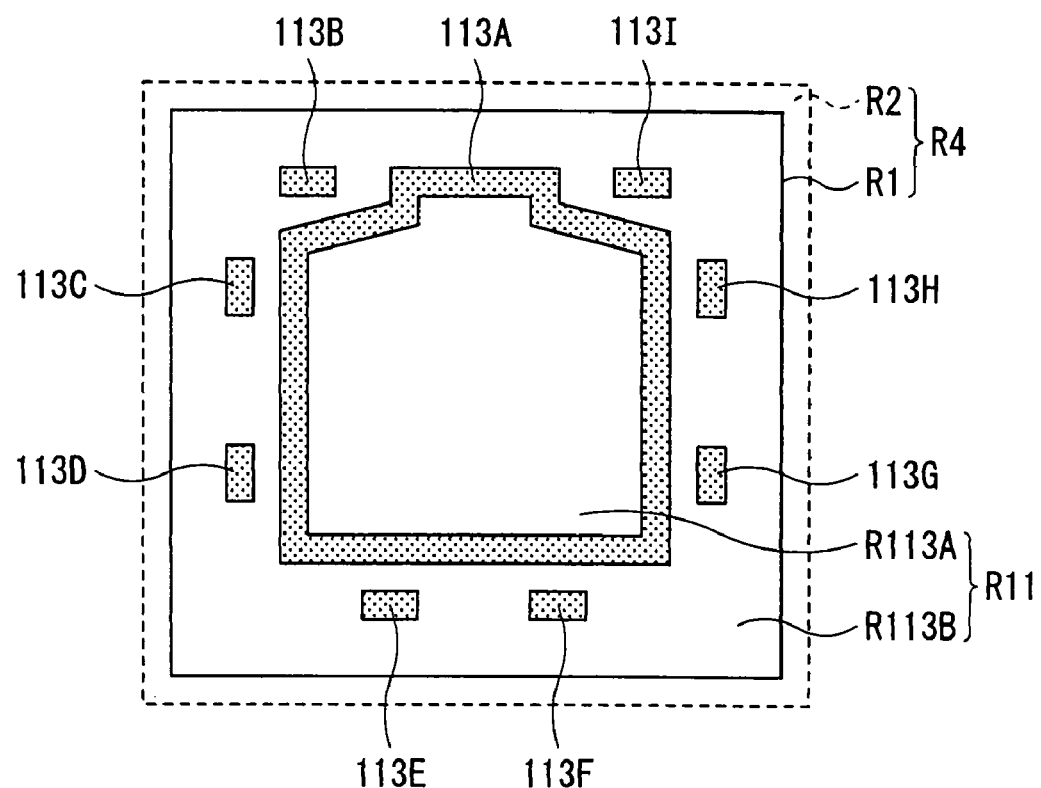
FIG. 23 is a plan view showing one production process in the method of manufacturing the thin film magnetic head shown in FIG. 21.
Figure 24:
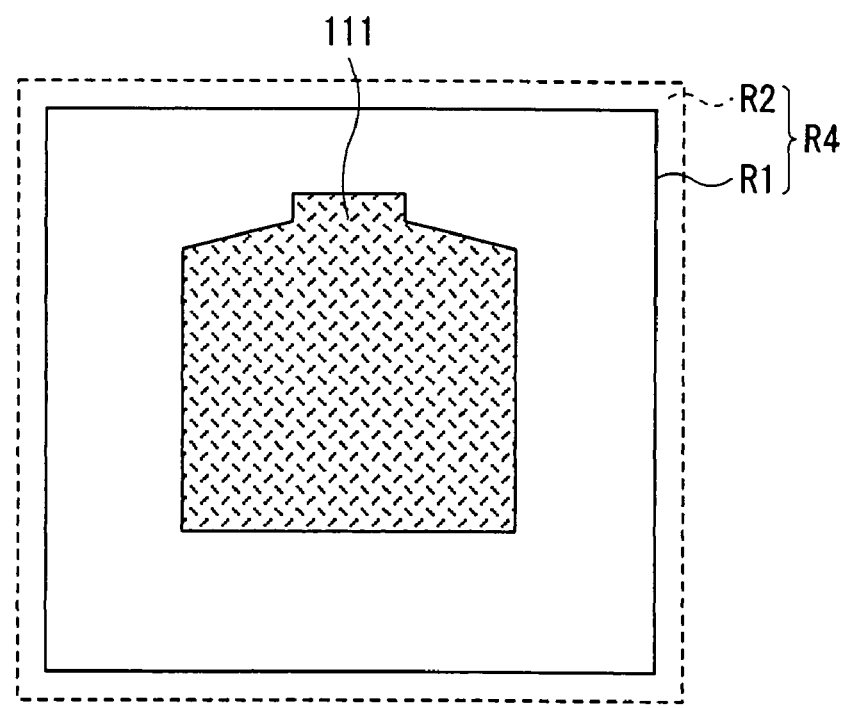
FIG. 24 is a plan view showing another production process subsequent to FIG. 23.

Photoresist patterns 113B to 113I, which are configured and arranged as shown in FIG. 23, are formed simultaneously with the formation of the photoresist pattern 113A. The photoresist pattern 113A as a photoresist frame is disposed so as to surround a portion R113A in which the lower shielding layer 111 will be formed (hereinafter called formation portion). The photoresist patterns 113B to 113I as an auxiliary pattern are desirably disposed symmetrically each other with respect to the photoresist pattern 113A. In FIG. 23, the photoresist pattern 113B vs. the photoresist pattern 113I, the photoresist pattern 113C vs. the photoresist pattern 113H, the photoresist pattern 113D vs. the photoresist pattern 113G, and the photoresist pattern 113E vs. the photoresist pattern 113F are arranged symmetrically, respectively. It is further desirable that configurations and dimensions of the photoresist patterns 113B to 113I are all equal to each other, and a part of the width thereof is equal to a part of the width of the photoresist pattern 113A. Here, it is defined that an auxiliary portion R113B is an area excluding the areas occupied by the photoresist pattern 113 (photoresist patterns 113A to 113I) and the formation portion R113A from the unit field R4. Accordingly, sum total of the formation portion R113A and the auxiliary portion R113B are taken as an area to be plated, denoted by the plating portion R113.

After forming the photoresist pattern 113, plating is performed using the foregoing plating device to form a plating layer (not shown) made of NiFe so that the plating portion R113 may be occupied therewith. Then the lower shielding layer 111 of a specified shape, which is formed by the plating layer and the plating foundation layer and formed on the formation portion R113A, is obtained as with the above-mentioned first embodiment (refer to FIG. 24).

Figure 25:
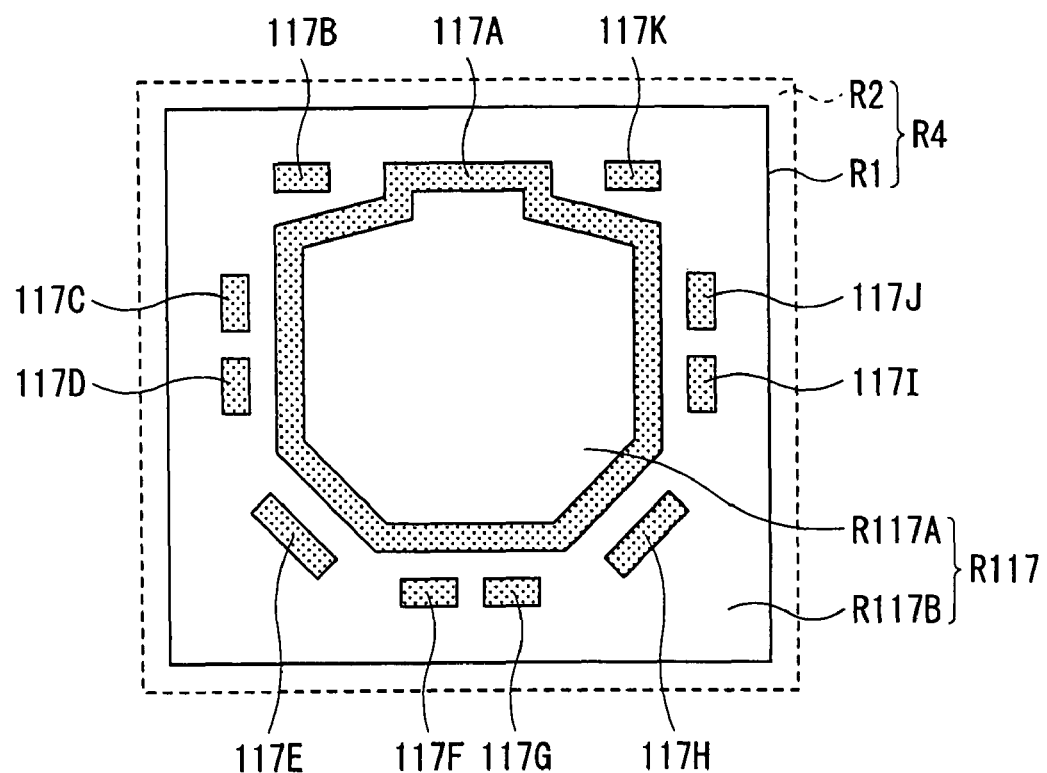
FIG. 25 is a sectional view showing another production process subsequent to FIG. 24.
Figure 26:
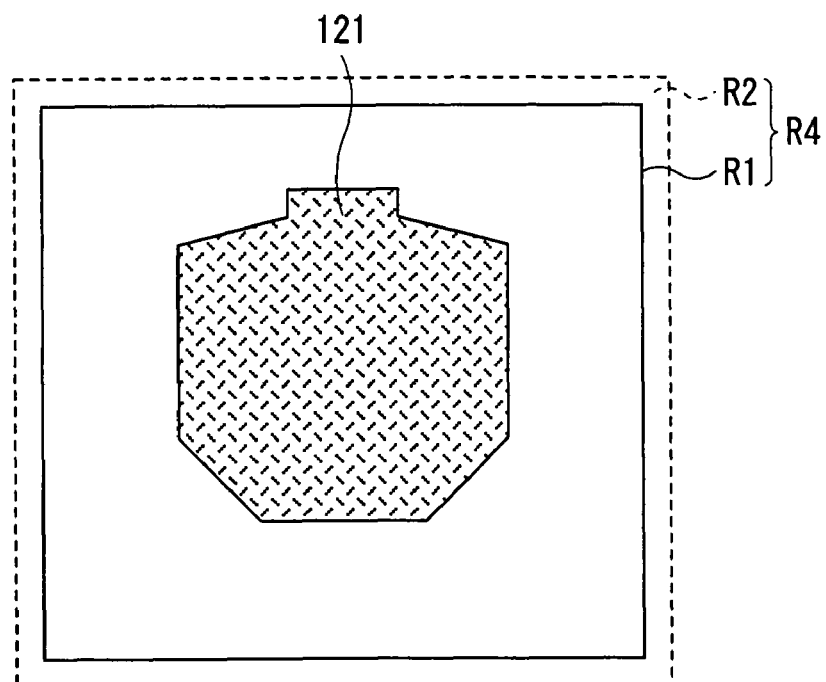
FIG. 26 is a plan view showing another production process subsequent to FIG. 25.

The upper shielding layer 121 can be formed as with the case of the lower shielding layer 111. Namely, after forming a plating foundation layer (not shown) made of NiFe so that the surface of the upper gap layer 120 may be covered, photoresist patterns 117A to 117K (hereinafter generically called photoresist pattern 117) of a specified shape are arranged in a specified position as shown in FIG. 25. The photoresist pattern 117A is disposed so as to surround a portion R117A in which the upper shielding layer 121 will be formed (formation portion), and works as a photoresist frame for defining the outline of the upper shielding layer 121. On the other hand, photoresist patterns 117B to 117K works as an auxiliary pattern. After forming the photoresist pattern 117, the upper shielding layer 121 of the specified shape, which is formed by the plating layer and the plating foundation layer and formed in the formation portion R117A, is obtained as with the case of the lower shielding layer 111 (refer to FIG. 26).

Here, it is defined that an auxiliary portion R117B is an area excluding the areas occupied by the photoresist pattern 117 and the formation portion R117A from the unit field R4. Herein, sum total occupation area of the photoresist pattern 117 is made equal to that of the photoresist pattern 113; In other words, the occupation area of a plating portion R117, which is the sum total of the formation portion R117A and the auxiliary portion R117B, is made equal to the occupation area of the plating portion R113.

In the second embodiment of the present invention, as described above, since sum total of the occupation area of the photoresist pattern 113 and that of the photoresist pattern 117 are equal to each other, an electrodeposition area, which is an area to be plated with plating layer, is also equal in each layer of the thin film magnetic head. Accordingly, a value of plating-current density can be kept constant easily without changing a current value. As a result, the lower shielding layer 111 and the upper shielding layer 121, which have an almost same composition each other, can be formed very efficiently.

First Example

A detailed example of the present invention will be explained hereinbelow.

In the following example (a first example) of the present invention, a layered film was produced by plating technique with use of a photoresist pattern corresponding to that shown in the fifth modification (FIGS. 20A to 20C) of the above-mentioned first embodiment.

Specifically, the plating patterns M1 to M3 made of NiFe were respectively formed to have an average thickness of 2 μm respectively, in a specified region R1 of 900 μm×400 μm on a silicon substrate (plated substrate) of 6 inches in diameter. Plane sizes of the plating patterns M1 to M3 will be indicated later in Table 1. Width of each gap field R2 was 200 μm. The plating foundation layer 12 was formed to have an average thickness of 0.03 μm by sputtering. In forming the photoresist layer, "AZ5105P" of AZ Electronic Materials' product was used as a photoresist material and applied, then was heat-treated for 90 seconds at 100 degrees C. Further, the latent image portion was formed using "NSR-EX 14C (DUV)", an exposure product of NIKON CORP. The exposing condition was set to: numerical aperture (NA): 0.6, diaphragm σ (ratio of illumination to lens NA): 0.6. After exposure, development was accomplished using an aqueous alkaline solution (2.38% aqueous tetramethylammonium hydroxide (TMAH)). Width W1 of each photoresist patterns 13A, 17A and 18A as a photoresist frame was 20 μm. Surface ratio of each plating portion (R13, R17, R18) to the unit field R4 was set to 85.6% in each of the first to third layers L1 to L3, as shown in Table 1. A Watts-type nickel (Ni) bath, added by iron ion, was used as the plating bath 31. The unnecessary plating layer 15 formed in each of the auxiliary portions R13B, R17B, and R18B was removed by wet etching with use of a ferric chloride solution as etching solution. Further, each photoresist pattern was removed with use of acetone or N-methylpyrrolidone (NMP).

Composition of the layered film, which was produced in the first example on the aforementioned condition, was confirmed in comparison with that of a first comparative example using a microscopic fluorescent-X-ray-spectrographic-analysis apparatus "JSM-6600F" of JEOL Co., Ltd. Here, the average content of nickel element in five arbitrary places was measured in each of the plating patterns M1 to M3. Results are shown in Table 1 with manufacturing conditions. In addition, a case where layered film including the plurality of plating patterns were produced by plating only with use of the photoresist frame and without any auxiliary pattern at all, is shown as the first comparative example in Table 1. Set current of power supply was set to 2.8 A in the first example, and 3.0 A in the first comparative example.

TABLE 1

| | Layers | Plane Size of Plating Pattern | Width of Photoresist Frame | Surface Ratio of Metal-plated Portion | Ni Content of Plating Pattern |
|---|---|---|---|---|---|
| Example 1 | First layer | 50 μm × 50 μm | 20 μm | 85.6% | 81.5% |
| | Second layer | 50 μm × 100 μm | 20 μm | 85.6% | 81.5% |
| | Third layer | 50 μm × 150 μm | 20 μm | 85.6% | 81.5% |
| Comparative Example 1 | First layer | 50 μm × 50 μm | 20 μm | 91.7% | 81.5% |
| | Second layer | 50 μm × 100 μm | 20 μm | 88.7% | 81.2% |
| | Third layer | 50 μm × 150 μm | 20 μm | 85.8% | 80.9% |

First Example

As shown by Table 1, it was confirmed that, in the case of the first comparative example, the nickel content decreased according to the reduction of the surface ratio of each of the Plating portions (electrodeposition areas). On the other hand, in the case of the first example, it was confirmed that the nickel content was equal in each of the Plating patterns (namely, the composition ratio of Ni to Fe was equal in each pattern) because surface ratio of the Plating portion (electrodeposition area) was uniformed in each of the first to the third layers. Thus, it proves that the plating method of the present invention is effective when the planar configuration and occupation area of the plating pattern is different in each layer.

Figure 27:
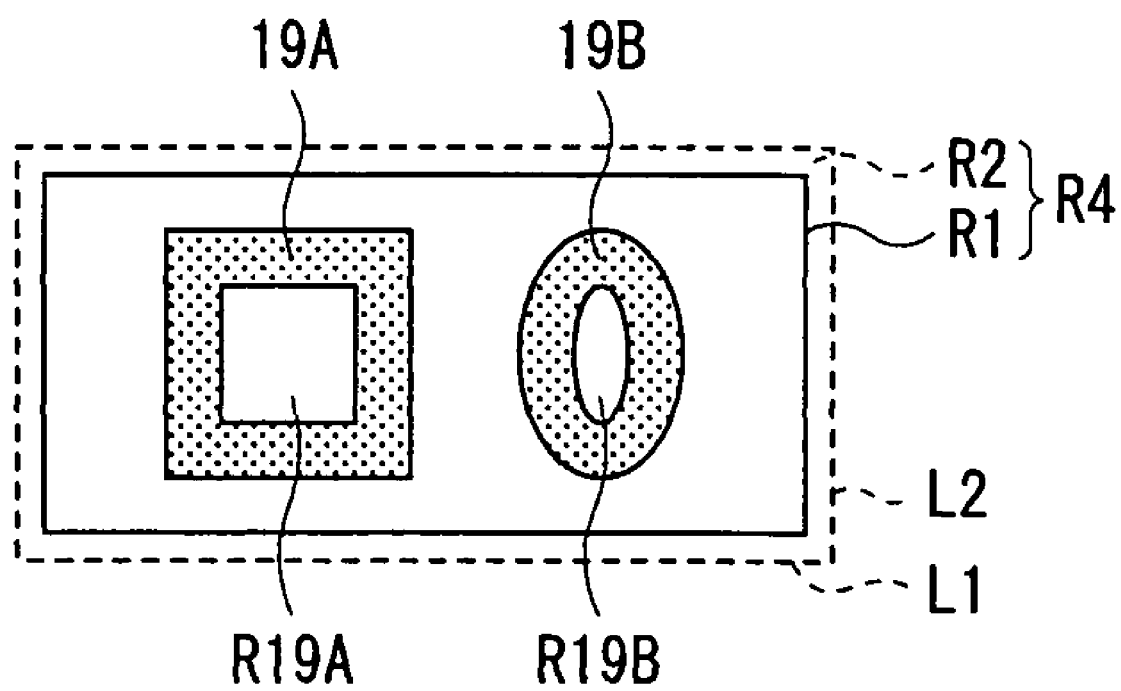
FIG. 27 is a sixth modification with regard to the plan view configuration of the resist pattern shown in FIG. 9.

As mentioned above, although the present invention has been explained with reference to some embodiments and examples (hereinafter generically called embodiments), the present invention is not limited to the embodiments, and various kinds of modifications are available. For example, although the above-mentioned embodiments explain the cases where the plating patterns M1 to M3 are layered continuously, it is not limited to this. For example, an arbitrary intervening layer, which is formed by a method other than the electroplating method, such as sputtering, may be disposed therebetween. In that case, the intervening layer may be a plating layer or may be an insulating layer. Besides, in the above-mentioned embodiments, although one plating pattern is formed in each layer, a plurality of plating patterns may be formed collectively in each layer. For example, the present invention is also applicable to a case where a photoresist frame 19A surrounding a formation portion R19A of a rectangular shape and a photoresist frame 19B surrounding a formation portion R19B of an elliptical shape are formed in the same layer to collectively produce a plating pattern of the rectangular shape and a plating pattern of the elliptical shape with use of the photoresist frames 19A and 19B, as shown in a sixth modification shown in FIG. 27.

Besides, in the above-mentioned embodiments, although the case is explained where the plating pattern of each layer is different from each other in configuration and dimension, it is not limited to this. For example, the present invention is also effective when only the configuration of the plating pattern mutually differs in each layer and the area thereof is all equal. Namely, when the plating pattern in each layer has a remarkably different configuration from each other, growing difference thereof may cause a considerable difference in the composition thereof even if the area of the plating pattern is equal to each other. In the present invention, even if the plating pattern in each layer has a different configuration from each other, difference in composition thereof can be suppressed very small by forming the layers so as to include other auxiliary plating layers thereon in addition to the plating patterns, respectively.

In the second embodiment as described above, although the case of forming a plurality of magnetic shielding layers all having the same composition to be used in a thin film magnetic head is explained, the present invention is not limited to this. For example, it is also suitable for formation of various plating patterns included in other electronic and magnetic micro devices, such as a thin film inductor, a common mode filter or a magnetic random-access memory (MRAM).

It should be understood by those skilled in the art that various modifications, combinations, sub-combinations and alterations may occur depending on design requirements and other factors insofar as they are within the scope of the appended claims or the equivalents thereof.

What is claimed is:

1. A method of plating for forming plating patterns of a plurality of layers, comprising process of forming a plating layer in each of the plurality of layers, the method comprising the steps of:
    forming a plating foundation layer,
    forming a resist frame having an aperture and a constant line width and one or more auxiliary resist patterns having a line width equal to the constant line width of the resist frame respectively on the plating foundation layer,
    forming the plating layer selectively by electrodeposition on the plating foundation layer other than portions covered with the resist frame and the auxiliary resist patterns,
    removing the resist frame and the auxiliary resist patterns, and
    removing the plating layer other than the plating pattern surrounded by the resist frame, wherein
    an area of the plating layer electrodeposited is constant in each of the plurality of layers, and
    a sum total of an area of the resist frame and the auxiliary resist patterns in each of the plurality of layers is constant.

2. The method of plating according to claim 1, wherein at least one of geometry and area of the plating pattern differs between the plurality of layers.

3. The method of plating according to claim 1, wherein a common plating bath is used for forming each plating layer.

4. The method of plating according to claim 1, wherein a common plating bath is used for forming each plating layer so that each plating layer has a uniform composition.

5. The method of plating according claim 1, wherein a plurality of the auxiliary resist patterns are formed symmetrically with respect to the resist frame.

6. The method of plating according to claim 1, wherein each plating layer includes a plurality of plating patterns.

7. The method of plating according to claim 1, wherein a plating pattern filling the aperture of the resist frame and an auxiliary plating pattern surrounding the resist frame are formed.

8. A method of manufacturing a micro device including plating patterns of a plurality of layers, comprising process of forming a plating layer in each of the plurality of layers including the steps of:
    forming a plating foundation layer,
    forming a resist frame having an aperture and a constant line width and one or more auxiliary resist patterns having a line width equal to the constant line width of the resist frame respectively on the plating foundation layer,
    forming the plating layer selectively by electrodeposition on the plating foundation layer other than portions covered with the resist frame and the auxiliary resist patterns,
    removing the resist frame and the auxiliary resist patterns, and
    removing the plating layer other than the plating pattern surrounded by the resist frame,
    wherein an area of the plating layer electrodeposited is constant in each of the plurality of layers, and
    a sum total of an area of the resist frame and the auxiliary resist patterns in each of the plurality of layers is constant.

* * * * *